US012563977B2

(12) United States Patent
Lin et al.

(10) Patent No.: US 12,563,977 B2
(45) Date of Patent: Feb. 24, 2026

(54) STRAINED FERROMAGNETIC HALL METAL SOT LAYER

(71) Applicant: Taiwan Semiconductor Manufacturing Co., Ltd., Hsinchu (TW)

(72) Inventors: Shy-Jay Lin, Jhudong Township (TW); Chien-Min Lee, Hsinchu (TW); MingYuan Song, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/355,551

(22) Filed: Jul. 20, 2023

(65) Prior Publication Data

US 2023/0371402 A1     Nov. 16, 2023

Related U.S. Application Data

(63) Continuation of application No. 17/144,958, filed on Jan. 8, 2021, now Pat. No. 11,805,705.

(60) Provisional application No. 63/023,384, filed on May 12, 2020.

(51) Int. Cl.
| | |
|---|---|
| *H10N 52/80* | (2023.01) |
| *H10B 61/00* | (2023.01) |
| *H10N 52/00* | (2023.01) |
| *H10N 52/01* | (2023.01) |

(52) U.S. Cl.
CPC ............. *H10N 52/80* (2023.02); *H10B 61/22* (2023.02); *H10N 52/00* (2023.02); *H10N 52/01* (2023.02)

(58) Field of Classification Search
CPC ........ H10N 52/80; H10N 52/01; H10N 52/00;

H10N 50/01; H10N 50/10; H10N 50/80; H10N 70/801; H10B 61/22; G11C 11/02; G11C 11/18; G11C 11/161
See application file for complete search history.

(56) References Cited

U.S. PATENT DOCUMENTS

| | | | |
|---|---|---|---|
| 2014/0056060 A1 | 2/2014 | Khvalkovskiy et al. | |
| 2014/0252439 A1 | 9/2014 | Guo | |
| 2014/0264671 A1 | 9/2014 | Chepulskyy et al. | |
| 2018/0123028 A1* | 5/2018 | Shiokawa | H10N 52/80 |
| 2018/0190419 A1 | 7/2018 | Swerts et al. | |
| 2019/0080738 A1 | 3/2019 | Choi et al. | |
| 2019/0088713 A1 | 3/2019 | Swertz | |

(Continued)

FOREIGN PATENT DOCUMENTS

| | | |
|---|---|---|
| CN | 109427959 A | 3/2019 |
| CN | 110660903 A | 1/2020 |

(Continued)

*Primary Examiner* — Latanya N Crawford Eason
(74) *Attorney, Agent, or Firm* — Slater Matsil, LLP

(57) ABSTRACT

A magnetic memory device includes a spin-orbit torque (SOT) induction structure which may be strained and seedless and formed with a perpendicular magnetic anisotropy. A magnetic tunnel junction (MTJ) stack is disposed over the SOT induction structure. A spacer layer may decouple layers between the SOT induction structure and the MTJ stack or decouple layers within the MTJ stack. One end of the SOT induction structure may be coupled to a first transistor and another end of the SOT induction structure coupled to a second transistor.

20 Claims, 17 Drawing Sheets

(56)  References Cited

U.S. PATENT DOCUMENTS

| | | | |
|---|---|---|---|
| 2019/0103553 A1 | 4/2019 | Hong | |
| 2019/0131518 A1* | 5/2019 | Yu ......................... | H10N 50/01 |
| 2019/0304653 A1 | 10/2019 | Oguz et al. | |
| 2019/0305212 A1 | 10/2019 | Gosavi et al. | |
| 2020/0006632 A1 | 1/2020 | Ouellette et al. | |
| 2020/0006637 A1 | 1/2020 | Gosavi et al. | |
| 2020/0043538 A1 | 2/2020 | Mihajlovic et al. | |
| 2020/0075670 A1 | 3/2020 | Lin et al. | |
| 2020/0136017 A1 | 4/2020 | Ashida et al. | |
| 2020/0136022 A1 | 4/2020 | Lin et al. | |
| 2020/0212294 A1* | 7/2020 | Lin ....................... | H10N 50/80 |
| 2020/0365308 A1* | 11/2020 | Lin ....................... | H01F 10/329 |
| 2021/0167278 A1 | 6/2021 | Ishitani et al. | |
| 2022/0165934 A1 | 5/2022 | Yamada et al. | |

FOREIGN PATENT DOCUMENTS

| | | | |
|---|---|---|---|
| CN | 110753963 A | 2/2020 | |
| DE | 102013109012 A1 | 3/2014 | |
| DE | 102014103119 A1 | 9/2014 | |
| JP | 6610847 B1 | 11/2019 | |
| KR | 20200002602 A | 1/2020 | |
| KR | 20200050352 A | 5/2020 | |

* cited by examiner write read

| Oper | WL1 | WL2 | SL1 | SL2 | BL |
|------|-----|-----|-----|-----|-----|
| Write 0 | 1 | 1 | Vw | 0 | f |
| Write 1 | 1 | 1 | 0 | Vw | f |
| FET1 read | 1 | 0 | 0 | f | Vread |
| FET2 read | 0 | 1 | f | 0 | Vread |

STRAINED FERROMAGNETIC HALL METAL SOT LAYER

PRIORITY CLAIM AND CROSS-REFERENCE

This application is a continuation of U.S. application Ser. No. 17/144,958, filed on Jan. 8, 2021, which claims priority to U.S. Provisional Application No. 63/023,384, filed on May 12, 2020, which applications are hereby incorporated by reference herein as if reproduced in its entirety.

BACKGROUND

A magnetic random access memory (MRAM) offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. One type of an MRAM is a spin transfer torque magnetic random access memory (STT-MRAM). An STT-MRAM utilizes a magnetic tunneling junction (MTJ) written at least in part by a current driven through the MTJ. Another type of an MRAM is a spin orbit torque (SOT) MRAM (SOT-MRAM), which generally requires a lower switching current than an STT-MRAM.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
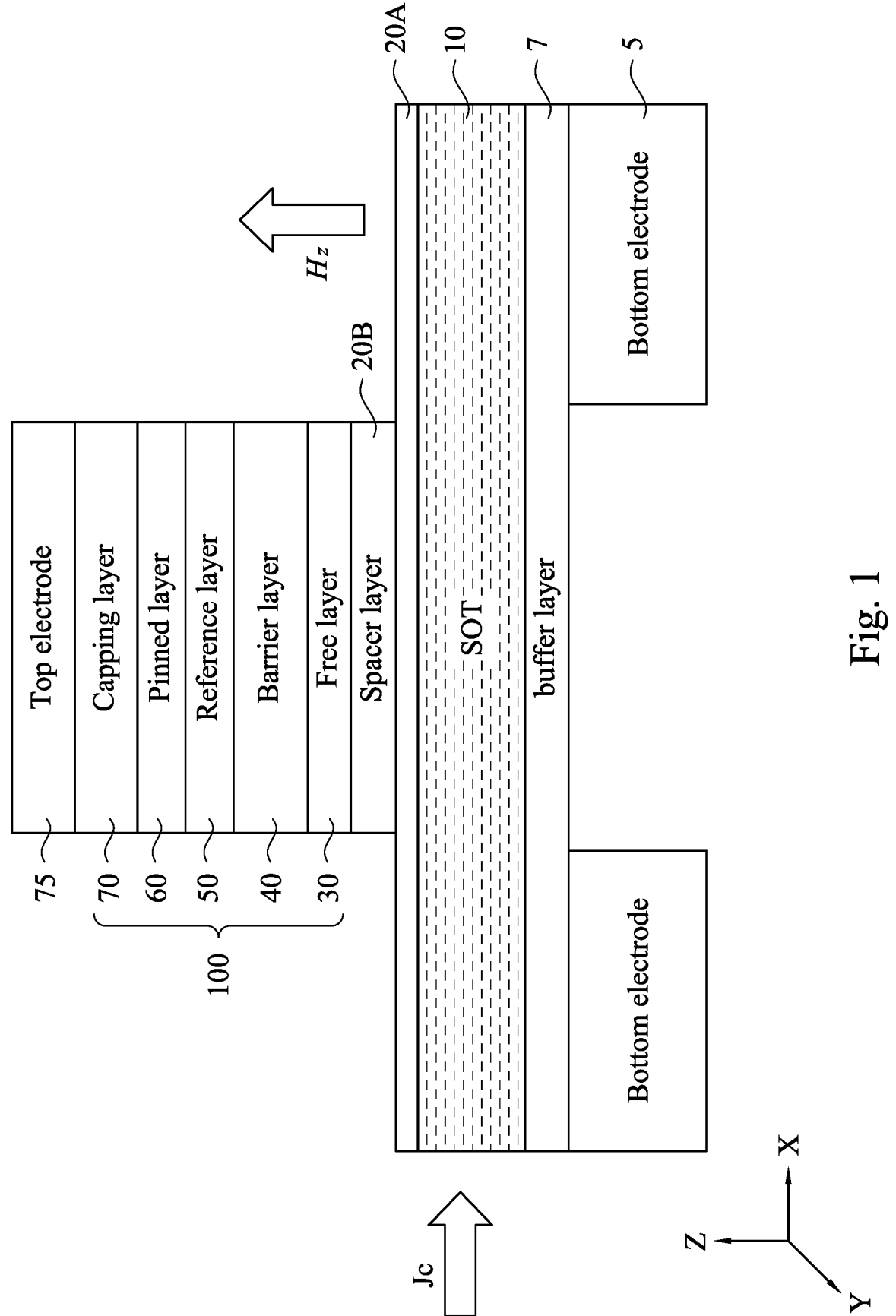
FIG. 1 is a schematic view of an SOT-MRAM cell according to some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes, and/or operations described with respect to one embodiment may be employed in the other embodiments, and detailed explanation thereof may be omitted.

Embodiments use various techniques to enhance the efficiency and operation of an SOT-MRAM device to control the spin and effective resistance of an MRAM film stack. Some embodiments use a Hall metal SOT induction structure which is strained to possess strong perpendicular magnetic anisotropy (PMA). The SOT induction structure can be constructed on a dielectric layer directly without a seed layer to keep high spin Hall angle (SHA). A magnetic coupling tuning spacer can be placed between the SOT induction structure and the magnetic tunnel junction (MTJ) film stack of the SOT-MRAM so that an internally generated magnetic field from the SOT induction structure can assist the free layer switching of the MTJ film stack. Embodiments can be combined and used on other MTJ film stack arrangements to provide SOT switching at reduced current requirements.

A spin-torque-transfer magnetic random-access memory (STT-MRAM), is one of the next generation memory technologies for CMOS integrated circuits (ICs). However, fast access applications, such as low-level cache requires fast access time but write speed is generally slower than read speed. The cache application for a central processing unit (CPU) and/or a microcontroller (MCU) additionally requires low-power consumption. An STT-MRAM, however, takes substantial current to change the magnetization state during the write operation. An STT-MRAM cell generally includes a magnetic tunnel junction (MTJ) film stack having a free magnetic layer, a reference or pinned magnetic layer, and a tunnel barrier layer. The magnetization of the magnetic layers can be either in-plane or perpendicular to the substrate plane. The free layer is the magnetic layer which has two energetically equivalent magnetic states, with the magnetization in the free layer parallel or antiparallel to the magnetization of the reference layer. By applying a current perpendicular to the MTJ film stack, the magnetic orientation (or moment) of the free magnetic layer can be changed, resulting in a change of resistance through the MTJ film stack, thereby effectively writing data to the STT-MRAM cell.

In contrast, magnetic switching by spin-orbit torque (SOT) has the potential to provide order-of-magnitude improvement on write current and speed, which makes SOT promising for high-speed, low-power cache memory applications.

In an SOT-MRAM, the magnetic moment of the free magnetic layer of an MTJ film stack is switched using the spin-orbit interaction effect generated by a current flowing adjacent to the free magnetic layer of the MTJ film stack. This current can flow in an SOT induction structure. Manipulating the free magnetic layer orientation causes a resistance change of the MTJ film stack, which may be used to record a data value in the cell. The magnetic moment of the free magnetic layer may be switched by spin-orbit torque only or with assistant magnetic field. There are three general types of SOT-MRAM, which depend on the orientation relationship between the magnetization of free magnetic layer and the write current flowing through the SOT induction structure. An x-type of SOT-MRAM has a free magnetic layer moment which is parallel to the current through the SOT induction structure and an assistant magnetic field which is orthogonal to the plane of the current flow in the SOT induction structure. A y-type of SOT-MRAM has a free magnetic layer moment which is perpendicular to, but in the same plane as, the direction of the current through the SOT induction structure. A z-type of SOT-MRAM has a free magnetic layer moment which is orthogonal to the plane of the current flow through the SOT induction structure and an assistant magnetic field is needed which is parallel to the current flow.

Although the present disclosure generally relates to an x-type of SOT-MRAM, some of the aspects discussed herein may be transferrable to the other types of SOT-MRAM devices, such as will be discussed below. In x-type of SOT-MRAM devices, the assistant magnetic field to switch the free magnetic layer may be generated externally to the cell, thereby complicating the cell structure. Embodiments of the present disclosure improve performance in several ways. In some embodiments of the present disclosure, a strained ferromagnetic SOT induction structure is provided. The strained ferromagnetic SOT induction structure not only provides the SOT current, but also provides a built-in perpendicular magnetic field which arises from its parallel magnetic anisotropy (PMA) and assists the switching of the free magnetic layer moment. In some of these embodiments, the strained ferromagnetic SOT induction structure may be formed without a seed layer. In some embodiments of the present disclosure, a spacer layer may be provided between the MTJ film stack and the SOT induction structure to modulate the magnetic coupling in-between. Tuning the thickness of the spacer layer with particularity serves to optimize the magnetic coupling strength between the perpendicular SOT induction structure and the in-plane free magnetic layer to enhance the write efficiency without impacting read operations. Optimum coupling provides the ability to generate the orthogonal assistant magnetic field necessary to switch the magnetic moment of the free magnetic layer without need of external field, thereby simplifying the design and operation of the memory cell. These embodiments may also be combined in various combinations.

Figure 2:
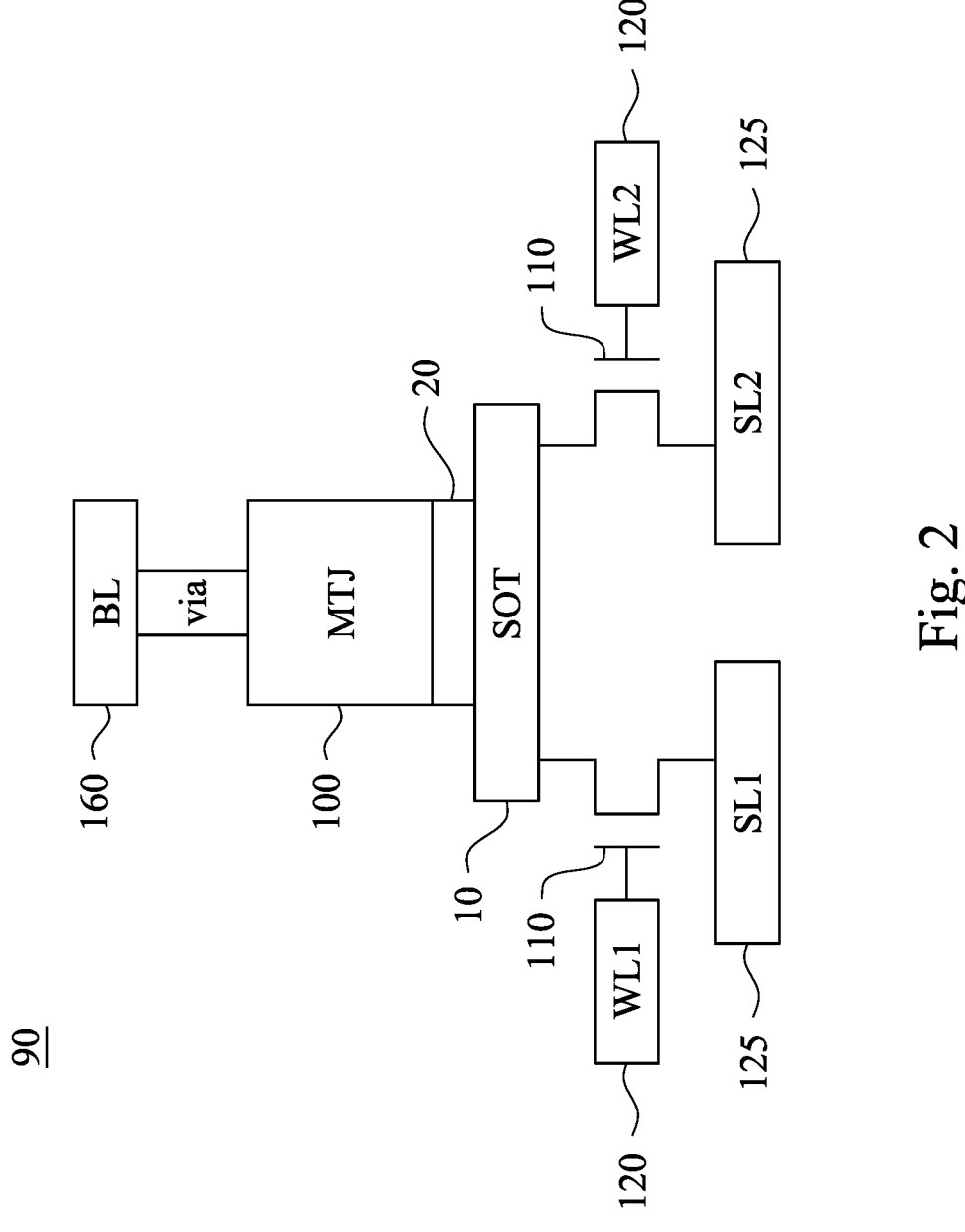
FIG. 2 is a schematic view of an SOT-MRAM cell according to some embodiments.

FIG. 1 illustrates a schematic view of the SOT-MRAM function elements of an SOT-MRAM cell 90 (see FIG. 2)

according to some embodiments of the present disclosure. These elements may include a bottom electrode 5 and/or buffer layer 7, an SOT induction structure 10, and an MTJ film stack 100. It should be understood that these layers may include multiple sub-layers comprising different materials, which will be discussed in detail below. The SOT induction structure 10 serves as a spin-orbit interaction active layer to provide induction influence on the MTJ film stack 100. The SOT induction structure 10 is a perpendicular Hall metal (p-HM) structure and may be alternatively referred to as a p-HM structure 10.

The MTJ film stack 100 may also include various configurations. In some embodiments, such as illustrated in FIG. 1, a free layer 30 is disposed over the SOT induction structure 10, a barrier layer 40 is disposed over the free layer 30, and a reference layer 50 is disposed over the barrier layer 40. In some embodiments, a magnetic coupling tuning spacer layer 20 (e.g., spacer layer 20A and/or spacer layer 20B) may be interposed between the SOT induction structure 10 and the free layer 30. Other embodiments may use other arrangements for the MTJ film stack 100. For example, in some embodiments, the structure of FIG. 1 may be inverted, including all the layers of the MTJ film stack 100. As illustrated, the MTJ film stack 100 includes a pinned layer 60 and is "top pinned." In embodiments inverting the structure of the MTJ film stack 100, the resulting film stack would be considered "bottom pinned." This is discussed in further detail below.

With reference to FIG. 1, the magnetic moment of the free layer 30 is switched using the spin-orbit torque effect. In some embodiments, the magnetic moment of the free layer 30 is switched using only the spin-orbit torque effect. In other embodiments, the magnetic moment of the free layer 30 is switched using a combination of effects. For example, the magnetic moment of the free layer 30 is switched using spin transfer torque as a primary effect that may be assisted by spin-orbit torque effect. In other embodiments, the primary switching mechanism is spin-orbit torque effect. In such embodiments, another effect including, but not limited to, spin transfer torque, may assist in switching.

The SOT induction structure 10 may be formed over an optional bottom electrode 5 and/or optional buffer layer 7. The bottom electrode 5 may include one or more layers of Cu, W, Ta, TiN, TaN, Ru, Au, and Al. In some embodiments, the buffer layer may function as a structural isolation layer for the SOT induction structure 10 above, i.e., to separate the structure of the bottom electrodes 5 from the structure of the SOT induction structure 10. In some embodiments, the buffer layer 7 may also function as a seed layer for the SOT induction structure 10. In some embodiments, the buffer layer 7 may include a thinly deposited insulating material layer with tunneling capability, such as MgO deposited to a thickness between 2 Å and 9 Å.

As noted above, the SOT induction structure 10 is a spin orbit active interface that has a strong spin-orbit interaction and that can be used in switching the magnetic moment of the free layer 30. The SOT induction structure 10 is used in generating a spin-orbit magnetic field $H_z$. More specifically, a current Jc is driven in a plane through the SOT induction structure 10. Because the SOT induction structure 10 is a perpendicular Hall metal (p-HM), the spin-orbit magnetic field $H_z$ is generated perpendicular (orthogonal) to the direction of the current Jc. This spin-orbit magnetic field $H_z$ is equivalent to the spin-orbit torque T on magnetization, where $T=-\gamma[M \times H_z]$ in the free magnetic layer 30. The torque and magnetic field are thus interchangeably referred to as spin-orbit field and spin-orbit torque. This reflects the fact that the spin-orbit interaction is the origin of the spin-orbit torque and spin-orbit field. Spin-orbit torque occurs for the current Jc driven in a plane in the SOT induction structure 10 and a spin-orbit interaction. In contrast, spin transfer torque is due to a perpendicular-to-plane current flowing through the free layer 30, the barrier layer 40 and the reference layer 50, that injects spin polarized charge carriers into the free layer 30. The spin-orbit torque T may rapidly deflect the magnetic moment of the free layer 30 from its equilibrium state parallel to the easy axis. The spin-orbit torque T may tilt the magnetization of the free layer 30 considerably faster than conventional STT torque of similar maximum amplitude. In some embodiments, switching can be completed using spin-orbit torque. In other embodiments, another mechanism such as spin transfer torque may be used to complete switching. The spin-orbit field/spin-orbit torque generated may thus be used in switching the magnetic moment of the free layer 30.

The SOT induction structure 10 includes multiple layers, as indicated by the dashed lines. As noted above, the SOT induction structure 10 of FIG. 1 is a p-HM, or in other words has a perpendicular-to-plane magnetic anisotropy (PMA). The configurations and materials of the SOT induction structure 10 is discussed in greater detail below, with respect to FIGS. 3A and 3B.

Some embodiments utilize a strained SOT induction structure 10 which provides high PMA and high spin Hall angle (SHA) without the need of a thick (e.g., between 1 nm and 10 nm) heavy metal seed layer (e.g., tantalum). Whereas heavy metal seed layers can be used to achieve high PMA, heavy metal seed layers typically dilute SHA. In other words, thicker heavy metal seed layers provide current shunt paths without SHA contribution. Thus, eliminating the use of a heavy metal seed layer or reducing the thickness of a heavy metal seed layer is beneficial for increasing SHA if high PMA can be maintained. High PMA and high SHA benefits switching efficiency which therefore reduces write current when switching the free layer.

As noted above, the SOT induction structure 10 uses a Hall metal, so that interaction of the SOT induction structure 10 includes the spin Hall effect. For the spin Hall effect, a current Jc is driven in the plane of the SOT induction structure 10 (i.e., current-in-plane, substantially in the x-y plane in FIG. 1). In other words, the current Jc is driven perpendicular to the stacked direction of the films including the SOT induction structure 10 and the free layer 30 (i.e., perpendicular to the normal to the surface, the z-direction in FIG. 1). Charge carriers having spins of a particular orientation perpendicular to the direction of current and to the normal to the surface (z-direction) accumulate at the surfaces of the SOT induction structure 10. A majority of these spin-polarized carriers diffuse into the free layer 30. This diffusion results in the torque T on the magnetization of the free layer 30. Since torque on the magnetization is equivalent to the effective magnetic field on the magnetization, as set forth above, the spin accumulation equivalently results in the field $H_z$ on the free layer 30. The spin-orbit field for the spin-Hall effect is the cross product of the spin-orbit polarization and the magnetic moment of the free layer 30. As such, the magnitude of the torque is proportional to the in-plane current density Jc and spin polarization of the carriers. The spin-Hall effect may be used in switching the magnetic stacked layer shown in FIG. 1 when the polarization induced by the spin-Hall effect is parallel to the easy axis of the free layer 30. To obtain the spin-orbit torque T, the current pulse is driven in plane through the SOT induction structure 10. The resulting spin-orbit torque T counteracts damping torque, which results in the switching of the magnetization of the free layer 30 in an analogous manner to conventional STT switching.

The free layer 30 is a data storage layer having a magnetic moment that is switchable. Within the MTJ film stack 100 of a SOT-MRAM cell 90, the free layer 30 acts as a state-keeping layer, and its magnetic state determines the state of the SOT-MRAM cell 90. For example, the magnetic moment of the free layer 30 is controllable (e.g., by controlling a current flowing in the SOT induction structure 10), and by controlling the magnetic moment of the free layer 30 in this manner, the resistance of the SOT-MRAM cell 90 may be put in a high-resistance state or a low-resistance state. Whether the SOT-MRAM cell 90 is in a high-resistance state or a low-resistance state depends on the relative orientations of the magnetizations of the free layer 30 and the reference layer 50 (see below for more detail on the reference layer 50).

The free layer 30 may be formed of one or more ferromagnetic materials, such as cobalt iron boron (CoFeB), cobalt/palladium (CoPd), cobalt iron (CoFe), cobalt iron boron tungsten (CoFeBW), nickel iron (NiFe), Ru, Co, alloys thereof, the like, or combinations thereof. The free layer 30 may include multiple layers of different materials, such as a layer of Ru between two layers of CoFeB, a layer of Co between two layers of CoFeB, or a layer of Ru and a layer of Co between two layers of CoFeB, though other configurations of layers or materials may be used. In some embodiments, the material of the free layer 30 includes a crystalline material deposited to have a particular crystalline orientation, such as a (100) orientation. The total thickness of the free layer 30 may be between about 1 nm and about 4 nm. Embodiments utilize a free layer 30 having an in-plane magnetic anisotropy (IMA). A suitable thickness of the free layer 30 may be determined by the composition of the free layer 30 or the magnetic properties of the free layer 30.

In some embodiments, the barrier layer 40 is formed of one or more materials such as magnesium oxide and aluminum oxide, the like, or combinations thereof. In some embodiments, the material of the barrier layer 40 includes a crystalline material deposited to have a particular crystalline orientation, such as a (100) orientation. The material of the barrier layer 40 may be deposited to have the same crystalline orientation as the free layer 30. In some embodiments, the barrier layer 40 may have a thickness between about 0.3 nm and about 3 nm. In some cases, controlling the thickness of the barrier layer 40 may assist to control the resistance ($R_{MTJ}$) of the MTJ film stack 100. For example, a thicker barrier layer 40 may increase the resistance of the MTJ film stack 100. In some embodiments, performance of a SOT-MRAM cell 90 can be improved by controlling the resistance $R_{MTJ}$ of the MTJ film stack 100 to match the parasitic resistance of the circuit(s) connected to the SOT-MRAM cell 90. In some cases, matching the resistances in this manner can increase the ranges of operational conditions over which the SOT-MRAM cell 90 can be read. The barrier layer 40 may be thin enough such that electrons are able to tunnel through the barrier layer 40.

The reference layer 50 is second magnetic layer of which the magnetic moment does not change. The reference layer 50 may be made of any of the same materials as the free layer 30 as set forth above, and may have the same material composition as the free layer 30. In some embodiments, the reference layer 50 includes one or more layers of magnetic materials. In some embodiments, the reference layer 50 includes a layer of a combination of cobalt (Co), iron (Fe), and boron (B), such as Co, Fe, and B; Fe and B; Co and Fe; Co; and so forth. In some embodiments, the material of the reference layer 50 includes a crystalline material deposited to have a particular crystalline orientation, such as a (100) orientation. The material of the reference layer 50 may be deposited to have the same crystalline orientation as the barrier layer 40. In some embodiments, a thickness of the reference layer 50 is in a range from about 0.2 nm to about 8 nm.

The pinned layer 60 is a hard bias layer used to pin the spin polarization direction of the reference layer 50 in a fixed direction. Pinning the spin polarization direction of the reference layer 50 allows the SOT-MRAM cell to be toggled between a low-resistance state and a high-resistance state by changing the spin polarization direction of the free layer 30 relative to the reference layer 50. Because the pinned layer 60 is formed over the reference layer 50, the example MTJ film stack 100 shown in FIG. 1 may be considered a "top-pinned" MTJ stack. In some embodiments, however, the order of the layers of the MTJ film stack 100 may be reversed. In such embodiments, because the reference layer 50 would be formed over the pinned layer 60, such an MTJ film stack may be considered a "bottom-pinned" MTJ stack.

The pinned layer 60 may include multiple layers of different materials, in some embodiments, and may be referred to as a synthetic anti-ferromagnetic (SAF) layer. For example, the pinned layer 60 may comprise a stack of one or more ferromagnetic layers and one or more non-ferromagnetic layers. For example, the pinned layer 60 may be formed from a non-ferromagnetic layer sandwiched between two ferromagnetic layers or may be a stack of alternating non-ferromagnetic layers and ferromagnetic layers. The ferromagnetic layers may be formed of a material such as Co, Fe, Ni, CoFe, NiFe, CoFeB, CoFeBW, alloys thereof, the like, or combinations thereof. The non-ferromagnetic layers may be formed of material such as Cu, Ru, Ir, Pt, W, Ta, Mg, the like, or combinations thereof. In some embodiments, the ferromagnetic layer(s) of the pinned layer 60 may have a thickness between about 2 nm and about 5 nm. In some embodiments, a thicker pinned layer 60 may have stronger antiferromagnetic properties, or may be more robust against external magnetic fields or thermal fluctuation. In some embodiments, the non-ferromagnetic layer(s) of the pinned layer 60 may have a thickness between about 2 Å and about 10 Å. For example, the pinned layer 60 may include a layer of Ru that has a thickness between about 4 Å and about 8.5 Å, though other layers or thicknesses are possible. In some embodiments, one or more layers of the pinned layer 60 includes a crystalline material deposited to have a particular crystalline orientation, such as a (iii) orientation. The pinned layer 60 may be formed to have an in-plane magnetic anisotropy (IMA), that is, in the same plane as the horizontal direction of the pinned layer 60. In some embodiments, a total thickness of the pinned layer 60 is in a range from about 3 nm to 25 nm.

In some embodiments, the pinned layer 60 may include an anti-ferromagnetic material (AFM) layer such as PtMn or IrMn to provide strong exchange bias to fix the pinned layer. This forms a "spin-valve structure" and provides better stability of the pinned layer. Without the AFM layer, the pinned layer 60 is less stable and may be referred to as a "pseudo-spin valve."

The capping layer 70 may be a single or multi-layer structure that serves both to protect the layers under the capping layer 70 during subsequent processes and to provide a top electrode for an overlying via or metal line to connect to. The layer(s) may be formed of a non-ferromagnetic material such as such as Cu, Ru, Ir, Pt, W, Ta, Mg, Ti, TaN, TiN, the like, or combinations thereof. In some embodiments, the capping layer 70 may include two non-ferromagnetic material layers sandwiching another non-ferromagnetic material layer, such as another one of such as Cu, Ru, Ir, Pt, W, Ta, Mg, Ti, TaN, TiN, or the like. For example, in some embodiments, the capping layer may include Ta or Ti sandwiched between two layers of Ru. The thickness of the capping layer 70 may be between about 3 nm and about 25 nm, though other thicknesses are contemplated. In embodiments using multiple layers for the capping layer 70, each layer may be between about 1 nm and about 12 nm.

A top electrode 75 may be disposed over the capping layer 70. The top electrode 75 may be used to provide electrical connection to a conductive pattern coupled to the top of the MTJ film stack 100. The top electrode 75 may be formed of any suitable material, such as titanium, titanium nitride, tantalum, tantalum nitride, the like, or combinations thereof.

The spacer layer 20 (e.g., the spacer layer 20A and/or the spacer layer 20B) is disposed between the free layer 30 and the SOT induction structure 10, in some embodiments. The spacer layer 20 relaxes the exchange coupling between the SOT induction structure 10 and the free layer 30. Because the SOT induction structure 10 has a PMA (perpendicular magnetic anisotropy) and the free layer 30 has an IMA (in-plane magnetic anisotropy), the spacer layer 20 serves to adjust the exchange coupling between the SOT induction structure 10 and the free layer 30 so they may maintain their particular magnetic anisotropies without deleterious coupling effects between the two. The optimum coupling allows for the internal generation of the field $H_z$ to assist the switching of the free layer 30 during a write operation. The ferromagnetic SOT induction structure 10 with PMA enhances the spin Hall angle (SHA) and therefore reduces the write current.

The spacer layer 20 may be formed from a metal material or a dielectric material, such as a metal oxide. Where the spacer layer 20 is formed from a metal material, the spacer layer 20 may be formed of a metal material such as a non-ferromagnetic metal material such as W, Ru, Pt, Mo, Ti, Mg, the like, or combinations thereof. Where the spacer layer 20 is formed form a dielectric material, the spacer layer 20 may be formed of a dielectric materials such as magnesium oxide ($MgO_x$), cobalt oxide ($CoO_x$), aluminum oxide ($AlO_x$), the like, or combinations thereof. In some embodiments, the spacer layer 20 may be formed from multiple layers which each may be a different material, including a metal material and/or a dielectric material. In some embodiments, the spacer layer 20A may be formed and patterned in conjunction with the SOT induction structure 10 and may have a similar foot print as the SOT induction structure 10. In some embodiments, the spacer layer 20B may be patterned when the MTJ film stack 100 is patterned such that the spacer layer 20B may have a similar foot print as the MTJ film stack 100. In some embodiments, both the spacer layer 20A and the spacer layer 20B may be present.

The total thickness of the spacer layer 20 (including spacer layer 20A and spacer layer 20B) depends on the materials of the free layer 30 and the SOT induction structure 10. The spacer layer 20 needs to have a minimum thickness which is determined by the minimum thickness necessary to reduce the exchange coupling of the free layer 30 and the SOT induction structure 10. The maximum thickness of the spacer layer 20 is determined by SOT effect. If the free layer 30 and the SOT induction structure 10 are too separated, the SOT effect will be diminished, thereby reducing SOT efficiency (spin Hall angle) and impacting magneto resistance. Also, where the spacer layer 20 is a dielectric material, the thickness of the spacer layer 20 affects resistance of the MTJ film stack 100. Depending on the materials selected for the spacer layer 20, the free layer 30, and the SOT induction structure 10, the spacer layer 20 may have a total thickness between about 2 Å and about 13 Å. In some embodiments, such as when the spacer layer 20 is made of a magnesium oxide, the spacer layer 20 may have a total thickness between about 6.5 Å and about 8.5 Å. In other embodiments, such as when the spacer layer 20 is made of magnesium, the spacer layer 20 may have a total thickness between about 10 Å and about 13 Å. In yet other embodiments, such as when the spacer layer 20 is made of titanium, the spacer layer 20 may have a total thickness between about 6.5 Å and about 10 Å. In still other embodiments, such as when the spacer layer 20 is made of tungsten, the spacer layer 20 may have a total thickness between about 5 Å and about 10 Å.

FIG. 2 illustrates a simplified schematic view of a SOT-MRAM cell 90 according to an embodiment of the present disclosure. Materials, configurations, dimensions, processes, and/or operations described with respect to FIG. 1 using like references may be employed in the following embodiments, and detailed explanation thereof may be omitted.

In some embodiments, the SOT induction structure 10 is coupled at one end to a switching device (e.g., a field effect transistor (FET)), referred to herein as FET 110. In some embodiments, the SOT induction structure 10 is coupled to a drain (or source) of the FET 110 (or FET1) through one or more conductive patterns (such as a via, a wiring, conductive lines, and/or a pad), and a gate of the FET is coupled to a word line WL1 120 through one or more conductive patterns. A source (or drain) of the FET1 is coupled to a source line SL1 125 through one or more conductive patterns. Another end of the SOT induction structure 10 is coupled to another switching device (e.g., a field effect transistor (FET)), also referred to herein as FET 110 (or FET2). In some embodiments, the SOT induction structure 10 is coupled to a drain (or source) of the FET2 through one or more conductive patterns, and a gate of the FET2 is coupled to a world line WL2 120 through one or more conductive patterns. A source (or drain) of the FET2 is coupled to a source line SL2 125 through one or more conductive patterns.

In some embodiments, the MTJ film stack 100 is disposed over the SOT induction structure 10 along the vertical direction (film stack direction) (Z direction). In some embodiments, the spacer layer 20 is disposed between the MTJ film stack 100 and the SOT induction structure 10. A bit line 160 is electrically coupled to the top of the MTJ film stack 100 through one or more conductive patterns.

In some embodiments, the MTJ film stack 100 may be inverted and the SOT induction structure 10 may be disposed over the MTJ film stack 100. In such embodiments the capping layer 70 may be omitted and the top electrode 75 (see FIG. 1) may become a bottom electrode 5 and the bottom electrode 5 may become a top electrode 75. The free layer 30 of the MTJ film stack 100 may be disposed at a top of the inverted MTJ film stack 100. Embodiments using a spacer layer 20 may have the spacer layer disposed between the SOT induction structure 10 and the MTJ film stack 100. Also in such embodiments, the wiring arrangement can remain the same, with a drain (or source) of the FET1 FET 110 coupled to the one end of the SOT induction structure 10 and a drain (or source) of the FET2 FET 110 coupled to the other end of the SOT induction structure through conductive patterns. Similarly, the bit line 160 may be coupled to the now bottom of the MTJ film stack 100 through one or more conductive patterns. Variations on these aspects are discussed with respect to the various Figures, below.

Using the arrangement of the elements as depicted in FIG. 2, the SOT-MRAM cell 90 may implement an x-type memory element without the need of using an external assist field to switch the free layer 30. Additionally, by utilizing SOT-MRAM cells 90 rather than STT-MRAM cells, the power requirements are less so that the transistor sizing of the FETs 110 (FET1 and FET2) can also be reduced. In some embodiments, the area size of the SOT-MRAM device can be about 50% to 75% of the area size of a comparable SRAM device and about the same size as an STT-MRAM device, while requiring less power, providing faster switching, and more robust longevity (an increased number of switching cycles).

If the word line WL1 120 is positive biased and the word line WL2 120 is positive biased, the gate of FETs 110 (FET1 and FET2) will be open. Then current Jc can flow in one direction across the SOT induction structure 10, inducing the free layer 30 to change magnetization direction. If the current direction is reversed, then the current Jc can flow in the opposite direction across the SOT induction structure 10, inducing the free layer 30 to change magnetization in a reverse direction. If either one of the transistors FETs 110 (FET1 or FET2) is not turned on, however, then current will not flow across the SOT induction structure 10 and a read operation can be performed through the MTJ film stack 100 at the bit line 160. The reading and writing operation is discussed in detail below with respect to FIG. 18.

Figure 3A:
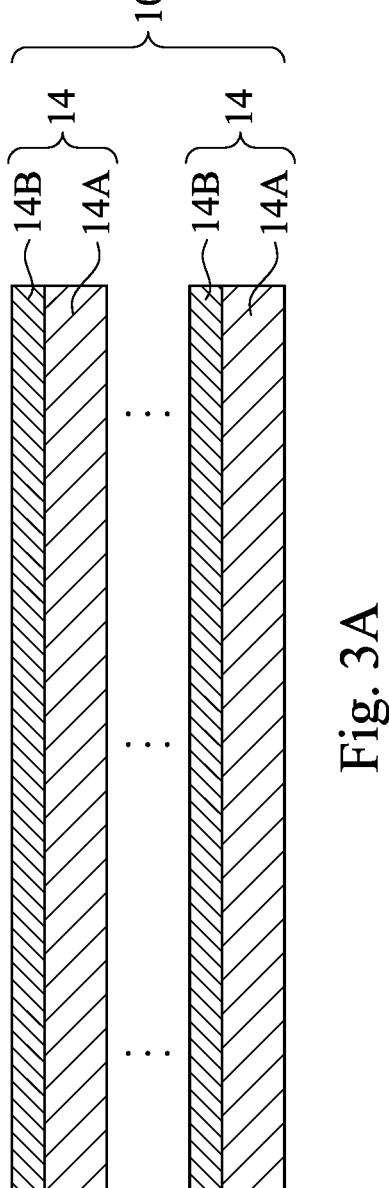
FIGS. 3A and 3B are illustrations of SOT induction structures, in accordance with various embodiments.
Figure 3B:
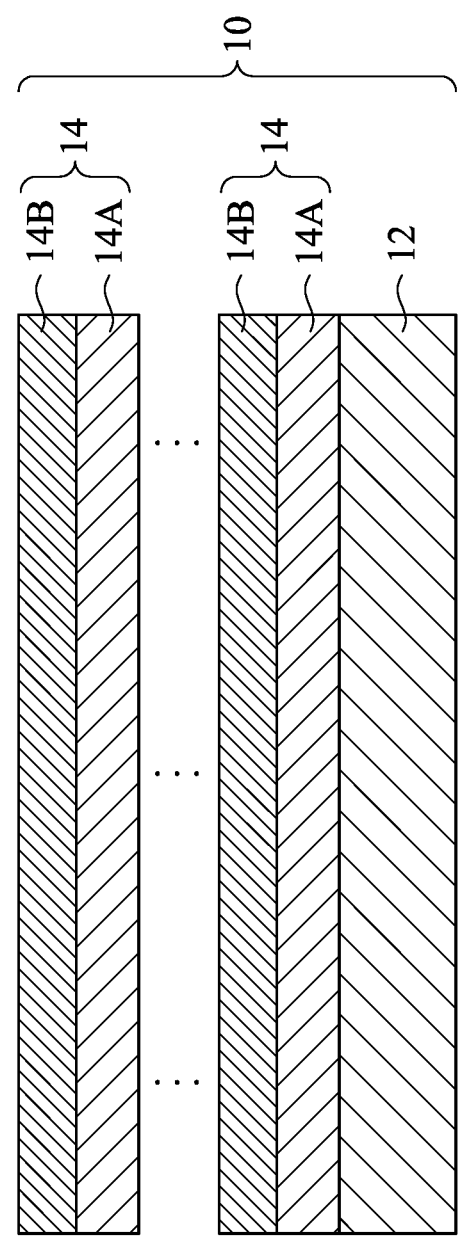

FIGS. 3A and 3B illustrate the SOT induction structure 10, in accordance with various embodiments. The SOT induction structure 10 is a spin-orbit active layer that causes a strong spin-orbit interaction with the free layer 30. In FIGS. 3A and 3B, the SOT induction structure 10 is a strained ferromagnetic structure having a perpendicular magnetic anisotropy (PMA). As noted above, a strained SOT induction structure 10 is beneficial for increasing SOT switching efficiency by achieving both high perpendicular-to-plan magnetic anisotropy (PMA) and high spin Hall angle (SHA) without utilizing a thick heavy metal seed layer.

In FIG. 3A, the SOT induction structure 10 includes alternating metal layer pairs 14. These metal layer pairs 14 are stacked to form the SOT induction structure 10. The first metal layer 14A may be made of a non-ferromagnetic metal such as platinum or palladium and the second metal layer 14B may be made of a ferromagnetic metal such as cobalt. The first metal layer 14A may have a thickness between 1 nm and 2 nm and the second metal layer 14B may have a thickness between 0.01 nm and 0.7 nm. Other thicknesses are contemplated and may be used. The metal layer pairs 14 are formed in repeated cycles to form the SOT induction structure 10 with multiple sets of the metal layer pairs 14. The SOT induction structure 10 may include 2 or more of these metal layer pairs 14, such as between 2 and 8 metal layer pairs 14, such as between 3 and 6 metal layer pairs 14.

By increasing the thickness ratio of the thickness of the first metal layer 14A to the thickness of the second metal layer 14B and increasing the number of cycles of the metal layer pairs 14, the effective perpendicular-to-plane magnetic anisotropy (PMA) of the SOT induction structure w may be increased. PMA is increased due to the high elastic strain between the first metal layer 14A and the second metal layer 14B due to high lattice misfit between the metal of the first metal layer 14A and the metal of the second metal layer 14B. For example, lattice misfit between the first metal layer 14A and the second metal layer 14B may be between about 6% to about 10%. Additional cycles of the metal layer pairs 14 increase the strain in the SOT induction structure w and provide high PMA similar to that otherwise provided by a heavy metal seed layer (which may be omitted). Similarly, the high ratio of the thickness of the first metal layer 14A to the thickness of the second metal layer 14B increases strain and PMA. The ratio may be between about 2 and 20 in some embodiments and between about 3 and w in other embodiments.

The level of magnetism associated with PMA can be characterized by the magnetized strength (coercivity, Hc) or magnetized degree (saturate magnetization, Ms) of the SOT induction structure w. In some embodiments, the coercivity may be between 200 Oe and 1000 Oe, such as between about 300 Oe and 600 Oe. The level of magnetism associated with PMA may also be characterized by the ratio Mr/Ms of the remnant magnetization Mr at zero applied field and the saturate magnetization Ms at saturate field (e.g., 1000 Oe). In some embodiments, the Mr/Ms ratio can be greater than about 0.30, for example, between about 0.30 and 0.90 or between about 0.60 and 0.80, demonstrating a strong PMA.

The SOT induction structure w may be formed by depositing the metal material of the first metal layer 14A using a blanket deposition technique including any appropriate deposition technique, such as CVD, PVD, ALD, the like, or combinations thereof. Next, the metal material of the second metal layer 14B may be deposited using a blanket deposition technique, including any of the same deposition techniques used to deposit the first metal layer 14A.

Following deposition of the cycles of the metal layer pairs 14, the total thickness of the SOT induction structure w may be between about 2 nm and about 25 nm, such as between about 3 nm to 18 nm, such as about 5 nm, though other values are contemplated and may be used. In some embodiments, after the deposition of the cycles of the metal layer pairs 14, spacer layer 20 may be deposited (e.g., spacer 20A of FIG. 1). The SOT induction structure w may be patterned to the final shape in a subsequent step, or may be patterned into its final shape at this point (prior to formation of any of the MTJ film stack 100).

Following deposition of the cycles of the metal layer pairs 14, an anneal may be performed. Post deposition annealing provides uphill diffusion in the metal layer pairs 14 and further increases PMA of the SOT induction structure 10. The post annealing may be done at a temperature between about 300° C. and about 400° C. for a time between 0.5 hours and 3 hours. In some embodiments, an in-situ perpendicular magnetic field (out of plane) may be applied during post annealing to further increase PMA due to the crystal anisotropy of the metal layer pairs 14. The magnetic field may be between about 1 tesla and 5 tesla during the anneal. In some embodiments, using the in-situ perpendicular field during anneal may transform the SOT induction structure 10 from being super-paramagnetic (neither in-plane nor perpendicular) to having a predominantly perpendicular magnetic anisotropy. In some embodiments, the SOT induction structure 10 may have partial in-plane and partial perpendicular anisotropy following formation, and using the in-situ perpendicular field during anneal may increase the perpendicular magnetic properties by between about 10% and 50% so that the SOT induction structure 10 has a predominantly perpendicular magnetic anisotropy post-anneal. The post deposition annealing may be performed immediately after depositing the metal layer pairs 14 to for the SOT induction structure 10 or may be performed in a later process, for example, after forming the MTJ film stack 100 layers.

FIG. 3B is similar to FIG. 3A with like references referring to like elements. The SOT induction structure 10 in FIG. 3B includes a base metal layer 12. The base metal layer 12 provides a similar function for the SOT induction structure 10 as utilizing a high ratio of the thicknesses of the layers of the metal layer pairs 14 discussed above with respect to FIG. 3A. Utilizing the base metal layer 12 allows more flexibility of depositing the metal layer pairs 14 while maintaining high PMA of the SOT induction structure 10. In some embodiments, the base metal layer 12 may be the same material as the metal of the first metal layer 14A. In essence, for the first cycle the metal of the first metal layer 14A may be made thicker than in subsequent cycles. In other embodiments, the base metal layer 12 may be a different material from the metal of the first metal layer 14A. For example, the metal of the first metal layer 14A may be platinum and the metal of the base metal layer 12 may be palladium or vice versa.

The thickness of the first metal layer 14A and the thickness of the second metal layer 14B may each be between about 0.01 nm and 2 nm, and the thickness of the base metal layer 12 may be between 2 nm and 5 nm. Due to the presence of the base metal layer 12, the thicknesses of the first metal layer 14A and the thickness of the second metal layer 14B may be equal and high PMA and SHA may still be achieved. In contrast with the arrangement illustrated in FIG. 3A, the thickness ratio of the first metal layer 14A to the second metal layer 14B is not as critical to maintain high PMA. For example, in some embodiments, the PMA of the SOT induction structure 10 as deposited using the base metal layer 12 may be between about 30% to about 60% greater than without the base metal layer 12 even when the thickness of the first metal layer 14A is the same as the thickness of the second metal layer 14B.

The base metal layer 12, the first metal layer 14A, and the second metal layer 14B of FIG. 3B may be deposited and annealed using processes and materials similar to those discussed above with respect to FIG. 3A. In-situ perpendicular field during anneal may increase the PMA of the SOT induction structure of FIG. 3B between about 10% and about 40%.

Figure 4:
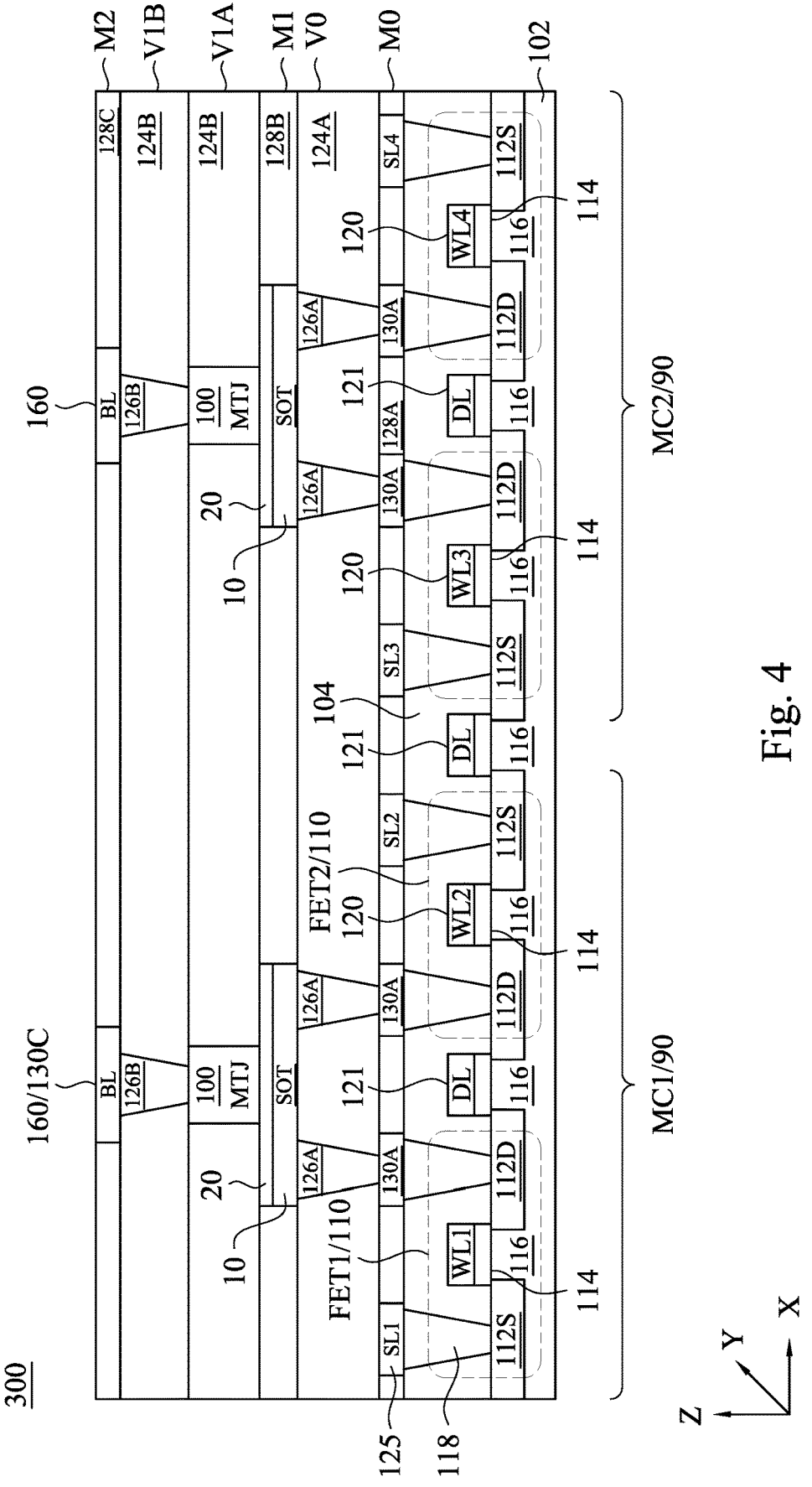
FIG. 4 is a cross-sectional view of an SOT-MRAM device, in accordance with some embodiments.
Figure 14:
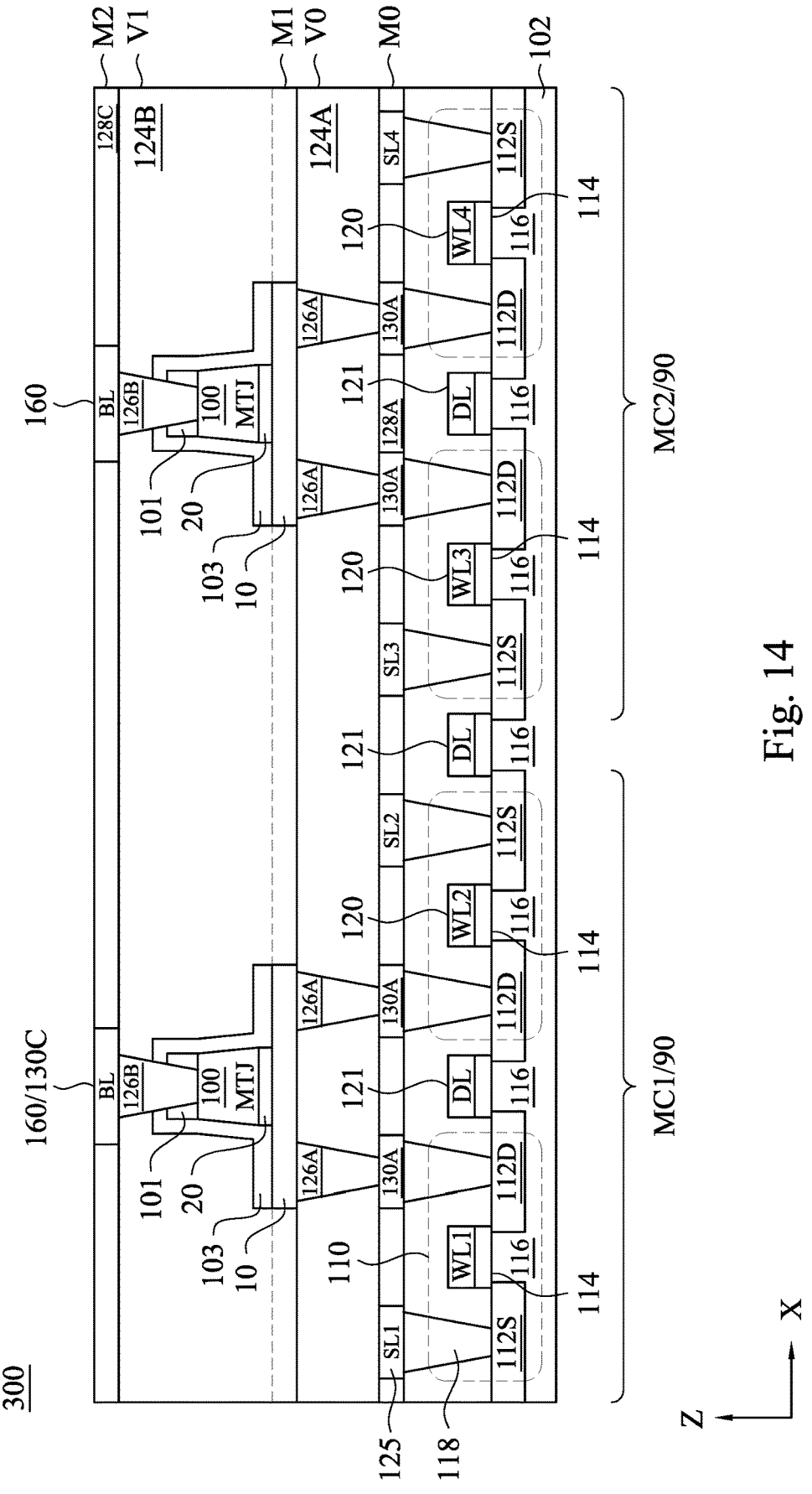
Figure 15:
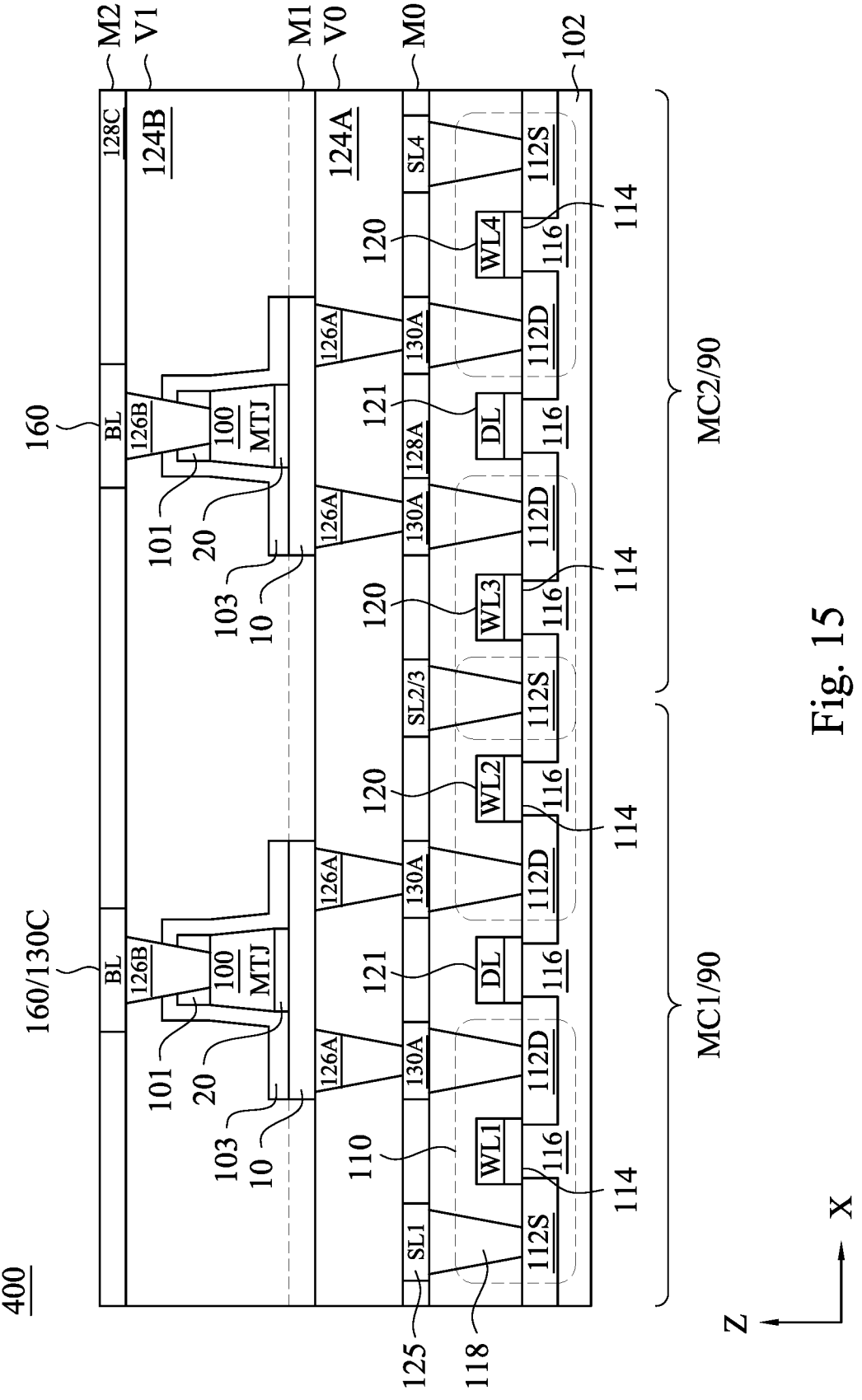
FIG. 15 is a cross-sectional view of an SOT-MRAM device, in accordance with some embodiments.
Figure 16:
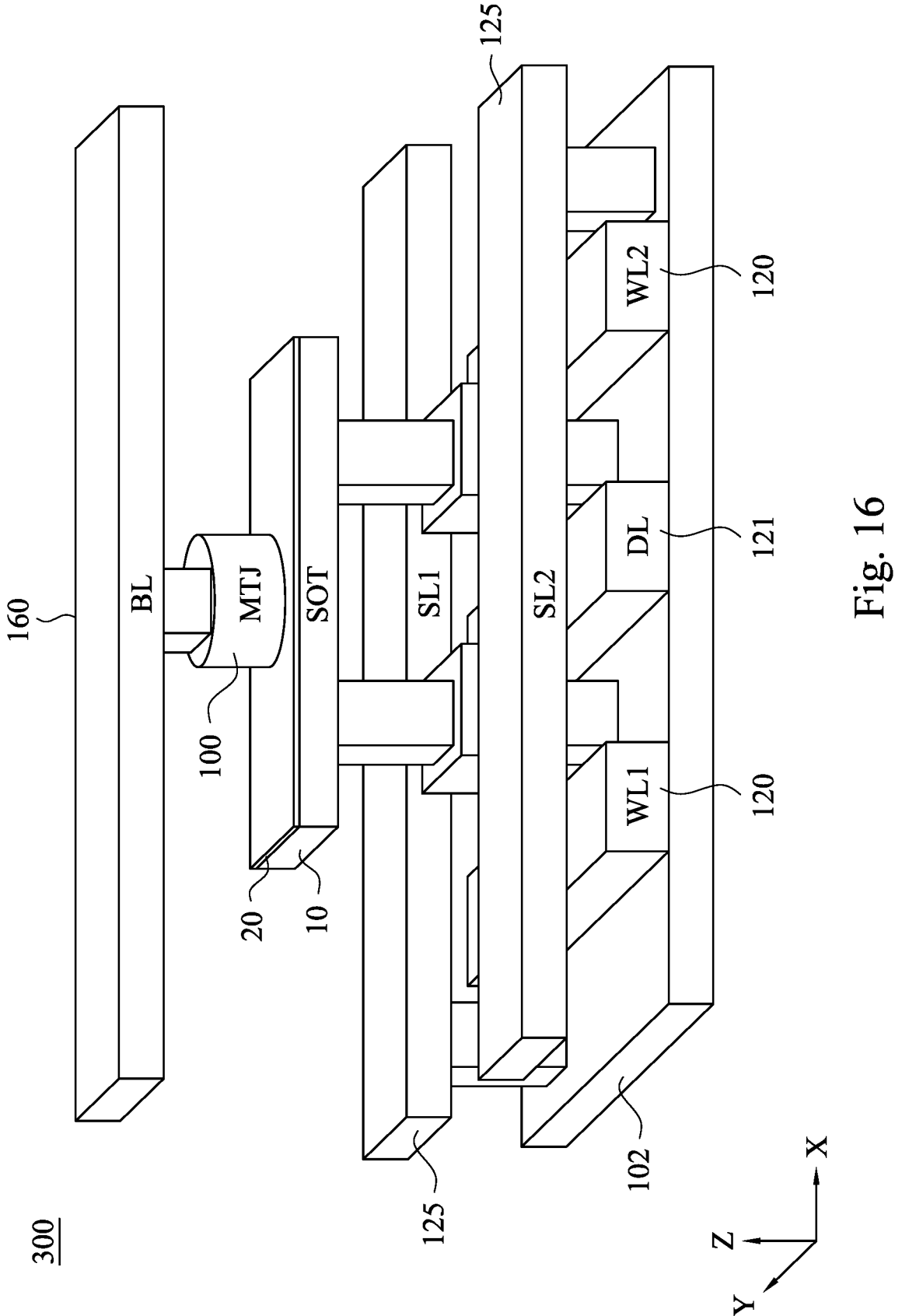
FIG. 16 is a perspective view of an SOT-MRAM device, in accordance with some embodiments.
Figure 17:
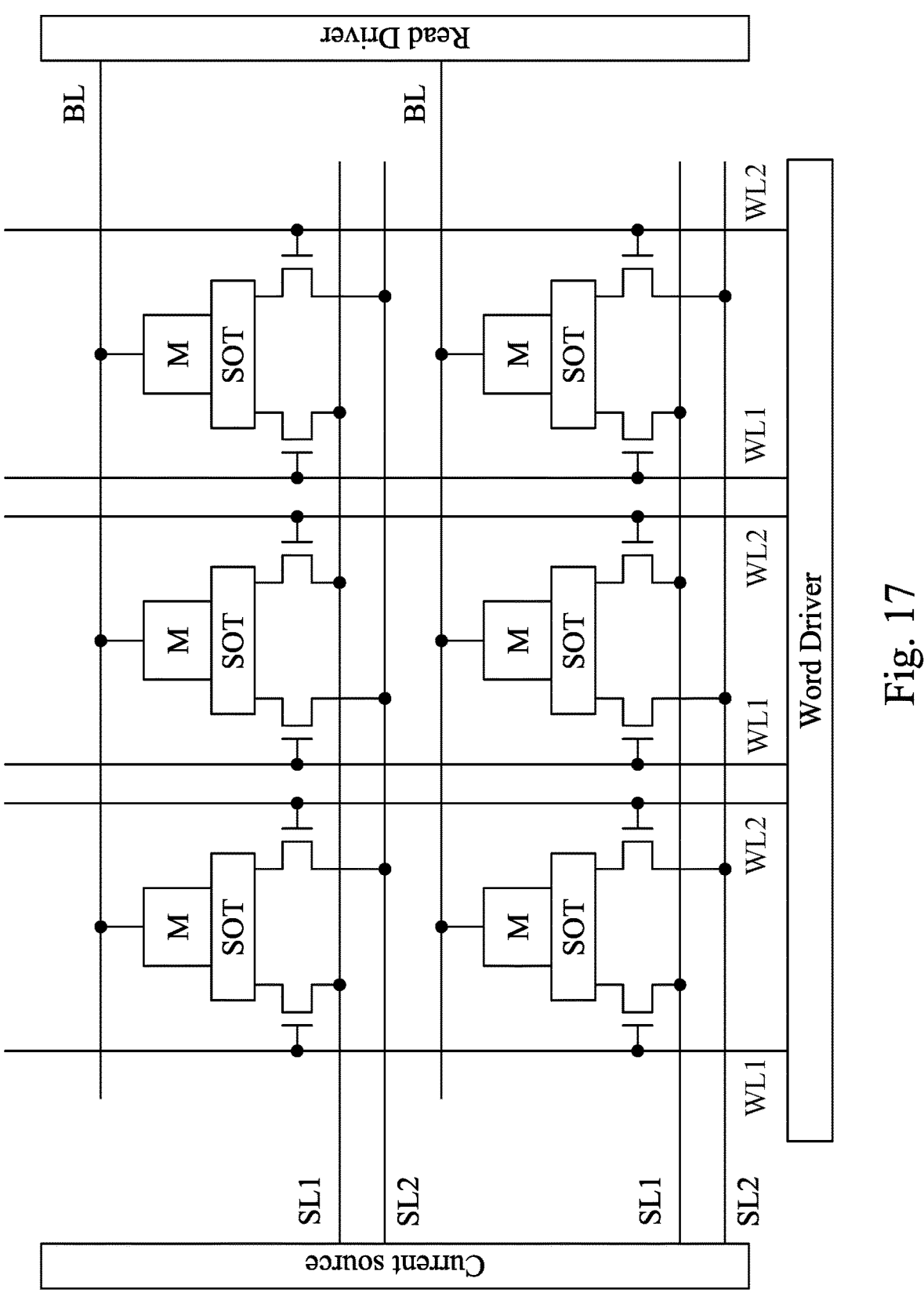
FIG. 17 is a circuit diagram of an SOT-MRAM device according to some embodiments.

FIGS. 4, 14, and 15 are schematic cross-sectional views of a portion of a SOT-MRAM device, in accordance with various embodiments. Some aspects of the illustrated layers of the SOT-MRAM device may be flattened into these cross-sectional views and it should be understood that some of the features depicted may exist in actuality in other cross-sections. FIG. 16 is a three-dimensional representation of the SOT-MRAM devices illustrated in FIGS. 4, 14, and 15. FIG. 17 is a circuit diagram consistent with those embodiments illustrated in FIGS. 4, 14, and 15.

Materials, configurations, dimensions, processes, and/or operations described with respect to FIGS. 1, 2, 3A, and 3B may be employed in the following embodiments, and detailed explanation thereof may be omitted. Referring in general to FIGS. 4, 14 and 15, in some embodiments, the SOT-MRAM device includes a layered structure having a multiple wiring layer structure. In some embodiments, the multiple wiring layer structure includes "Mx" (x=0, 1, 2, 3, . . . ) metal wiring layers, which are located at respective levels disposed over a substrate, and "Vy" (y=0, 1, 2, 3, . . . ) vias (contacts) connecting the My metal wiring layer to the My+1 metal wiring layer. The metal wiring layers include metal lines which are embedded in a dielectric material layer. The vias include conductive plugs embedded in an interlayer dielectric (ILD) material which separates adjacent metal wiring layers. For the purpose of illustration and labelling, the elements ending in "A" correspond to the x=0, y=0 levels, the elements ending in "B" correspond to the x=1, y=1 levels, the elements ending in "C" correspond to the x=3, y=3 levels, and so forth. In some embodiments, the even-number metal wiring layers extend in one direction (e.g., X) and the odd-numbered metal wiring layers extend in another direction (e.g., Y) crossing the one direction. In some embodiments, pitches for metal wirings may generally increase as the levels increase. For example, the metal wiring pitches in levels M3 and M4 may be the same and pitches for the metal wirings in M5 or higher may be the same and may be larger than the pitches for the metal wirings in M3 and M4.

In some embodiments, the metal wirings and vias are made of one or more of aluminum, cobalt, copper, a copper alloy, tungsten, titanium, titanium nitride, tantalum, tantalum nitride, alloys thereof, the like, or combinations thereof. The vias may also include barrier or adhesion material layers surrounding the sides of the vias and formed of one or more layers of titanium, titanium nitride, tantalum, tantalum nitride, tungsten nitride, ruthenium, rhodium, platinum, other noble metals, other refractory metals, their nitrides, combinations of these, or the like.

In some embodiments, the ILD layers are formed of any suitable dielectric material including, for example, a nitride such as silicon nitride, an oxide such as silicon oxide, SiOC, and SiOCN, SiCN, phosphosilicate glass (PSG), borosilicate glass (BSG), boron-doped phosphosilicate glass (BPSG), the like, or combinations thereof.

The contact plugs 118 connect a source region 112S or drain region 112D of the FETs no to the M0 metal wiring layer (e.g., conductive line 130A) through a dielectric layer 104. The source line SL1 125 is in the M0 metal wiring layer and coupled to the source region 112S of the FET 110 FET1. The source line SL2 125 is in the M0 metal wiring layer and coupled to the source region 112S of the FET 110 FET2. The drain region 112D of the FET 110 FET1 is coupled to one end of the SOT induction structure 10. The drain region 112D of the FET 110 FET2 is coupled to the other end of the SOT induction structure 10. The bit line BL 160 is above the MTJ film stack 100, in the M2 metal wring layer and coupled to the top of the MTJ film stack 100. The word line WL1 is coupled to the gate electrode of the FET 110 FET1 and the word line WL2 is coupled to the gate electrode of the FET 110 FET2.

It should also be understood that the schematic in FIG. 4 is only an illustration of one embodiment and changes may be made without departing from the spirit of the disclosure. For example, it should be understood that multiple intervening layers may be included as necessary to accommodate any desired wiring layout. In particular, when a particular element is described as being in a particular metal wiring layer, the disclosure contemplates that any desired number of metal wiring layers may be intervening between the described metal wiring layers. For example, where one element is described as being in the M2 metal wiring layer and another element is described as being in the M3 metal wiring layer, there may be any number of metal wiring layers between the M2 metal wiring layer and the M3 metal wiring layer. Also, as noted above, the MTJ film stack 100 may be formed such that the SOT induction structure 10 is disposed above the MTJ film stack 100.

In some embodiments, the FETs no are planar FETs, fin FETs, or gate-all-around FETs. The electrode 80 is coupled to a drain region 112D of a FET 110 and a source region 112S of the FET 110 is coupled to the source line SL 125. In some embodiments, the source region 112S is shared by two adjacent FETs 110 (see FIG. 15). In some embodiments, a pair of FETs 110 (FET1 and FET2) are separated by a dummy gate structure 121 from another pair of FETs 110 (e.g., in MC2 of FIG. 4). The word lines WL 120 are coupled to the gates of the FETs no and switch whether a current may flow from the source line SL 125 through the MTJ film stack 100 to the bit line BL 160.

Referring to FIG. 4, two SOT-MRAM cells 90 of the SOT-MRAM device 300 are illustrated, including MC1 and MC2. As illustrated in FIG. 4, the source regions 112S of adjacent SOT-MRAM cells 90 may be separated by a dummy gate structure 121, similar to the separation of the drain regions 112D of the FETs 110 (FET1 and FET2) by the dummy gate structure 121. In some embodiments, two of the adjacent SOT-MRAM cells 90 may share a common source region 112S (see, e.g., FIG. 15).

The SOT induction structure 10 may be disposed in the M1 metal wiring layer and may be coupled to the drain region 112D (or source region 112S) of each of the FETs 110 of MC1. The MTJ film stack 100 may be disposed on the SOT induction structure 10 in the V1 layer, for example in a bottom portion V1A of the V1 layer. A via 126B may connect the top of the MTJ film stack 100 to the bit line BL signal 160 in the M2 metal wiring layer. The source line SL1 and the source line SL2 may be disposed in the M0 metal wiring layer and may be coupled to the source region 112S (or drain region) of each of the FETs 110 (FET1 and FET2, respectively). The word line WL1 and the word line WL2 are respectively connected to the gate electrodes of each of the FETs 110 (FET1 and FET2, respectively). These connections may be brought up into the metal wiring layers by vias and wiring patterns in another cross-section. As illustrated in FIG. 4, the source lines (e.g., SL1 and SL2) are each directed in the Y direction and have a small cross-section along the X direction.

In some embodiments, the MTJ film stacks 100, SOT induction wiring structures 10, source lines 125 (SL1 and SL2), and bit lines BL 160 may each move down a metal wiring layer or up one or more metal wiring layers.

FIGS. 5 through 14 illustrate intermediate steps in the formation of the SOT-MRAM device 300 of FIG. 4. The materials which may be used to form the various structures and elements of the SOT-MRAM device 300 are described above and are not repeated.

Figures 5, 6:
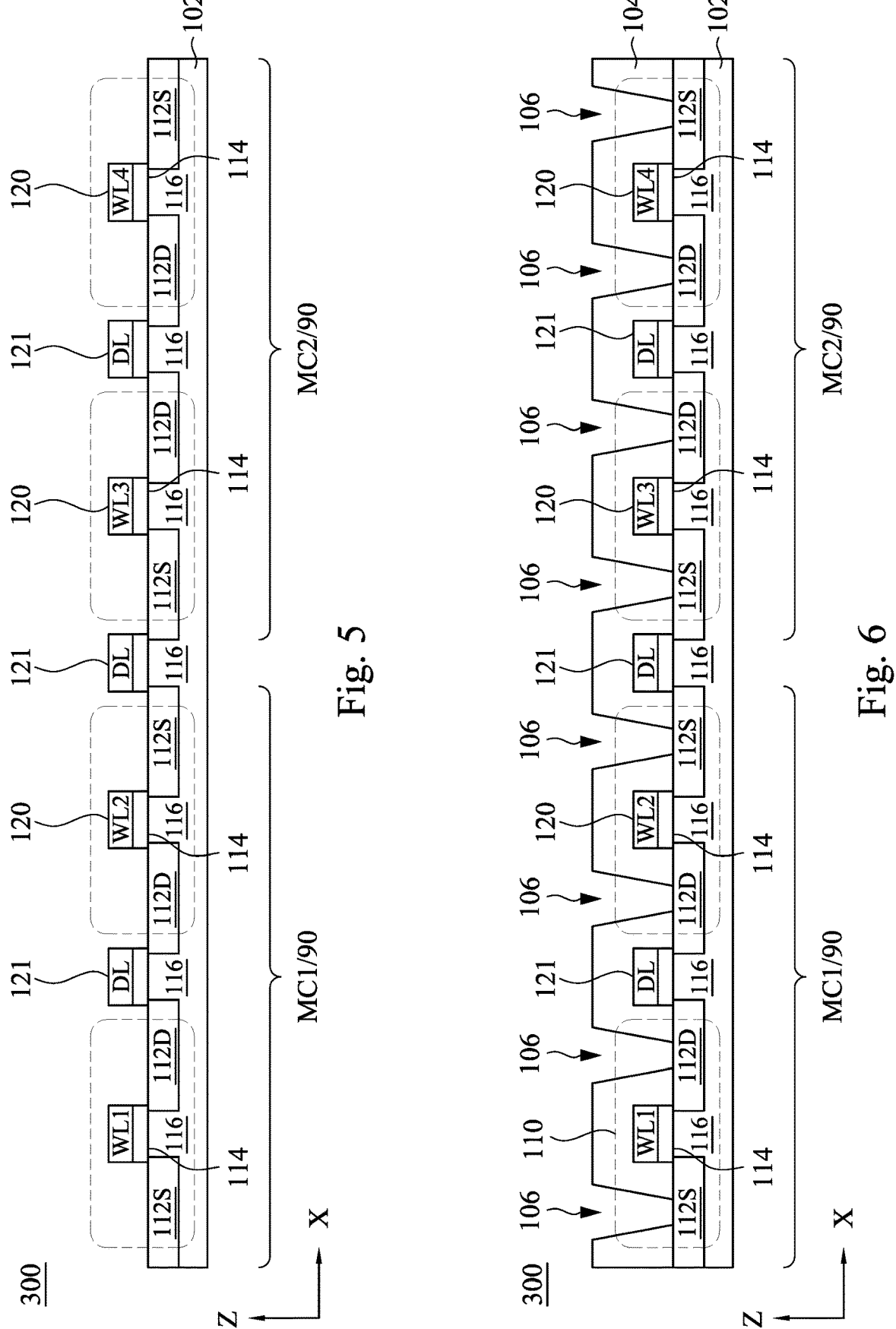
FIGS. 5 through 14 are intermediate steps used in formation of an SOT-MRAM device, in accordance with some embodiments.

FIG. 5 illustrates a cross-sectional view of a substrate 102 and multiple FETs no formed on the substrate 102, in accordance with some embodiments. The FETs 110 are part of the subsequently formed SOT-MRAM cells 90 of the SOT-MRAM device 300. Some example FETs no are indicated in FIG. 5. The substrate 102 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including silicon germanium (SiGe), GaAsP, AlInAs, AlGaAs, GaInAs, GaInP, and/or GaInAsP; or combinations thereof. Other substrates, such as multi-layered or gradient substrates, may also be used.

In some embodiments, the FETs no are Fin Field-Effect Transistors (FinFETs) comprising fins (or channel regions) 116, gate structures 114, and source regions 112S, and drain regions 112D. As shown in FIG. 5, the fins 116 are formed on the substrate 102 and may comprise the same material as the substrate 102 or a different material. In some embodiments, dummy fins (not shown) may be formed between some fins 116 to improve process uniformity. The gate structures 114 are formed over multiple fins 116 and extend in a direction perpendicular to the fins 116. In some embodiments, spacers (not shown in the Figures) may be disposed on the sidewalls of the gate structures 114. In some embodiments, dummy gate structures 121 may be formed between some gate structures 114 to improve process uniformity. The dummy gate structures 121 may be considered "dummy transistors" or "dummy FinFETs," in some embodiments. Some gate structures 114 are used as Word Lines in the SOT-MRAM device 300 (described in greater detail below), and have been labeled as "WL," such as "WL2," accordingly. The source regions 112S and the drain regions 112D are formed in the fins 116 on either side of the gate structures 114. The source regions 112S and the drain regions 112D may be, for example, implanted regions of the fins 116 or epitaxial material grown in recesses formed in the fins 116. In the embodiment shown in FIG. 5, one side of each fin 116 is adjacent source regions 112S and the other side of each fin 116 is adjacent drain regions 112D.

The FETs 110 shown in the Figures are representative, and some features of the FETs 110 may have been omitted from the Figures for clarity. In other embodiments, the arrangement, configuration, sizes, or shapes of features such as fins 116, dummy fins, gate structures 114, dummy gate structures 21, source regions 112S, drain regions 112D, or other features may be different than shown. In other embodiments, the FETs 110 may be another type of transistor, such as planar transistors.

In FIGS. 6, a dielectric layer 104 is formed over the substrate 102 and patterned to expose the source regions 112S and drain regions 112D, in accordance with some embodiments. The dielectric layer 104 may cover the FETs 110, and may be considered an Inter-Layer Dielectric layer (ILD) in some embodiments. The dielectric layer 104 may be formed of any suitable dielectric material including, for example, any of the materials listed above for an ILD. The dielectric layer 104 may be formed using any acceptable deposition process, such as spin coating, physical vapor deposition (PVD), chemical vapor deposition (CVD), the like, or a combination thereof. In some embodiments, the dielectric layer 104 may be a low-k dielectric material, such as a dielectric material having a dielectric constant (k value) lower than about 3.0, for example.

The dielectric layer 104 may be patterned to form openings 106 that expose the source regions 112S and the drain regions 112D for subsequent formation of contact plugs 118 (see FIG. 3). The dielectric layer 104 may be patterned using a suitable photolithography and etching process. For example, a photoresist structure (not shown) may be formed over the dielectric layer 104 and patterned. The openings 106 may be formed by etching the dielectric layer 104 using the patterned photoresist structure as an etching mask. The dielectric layer 104 may be etching using a suitable etching process, such as a wet etching process or a dry etching process.

Figures 7, 8:
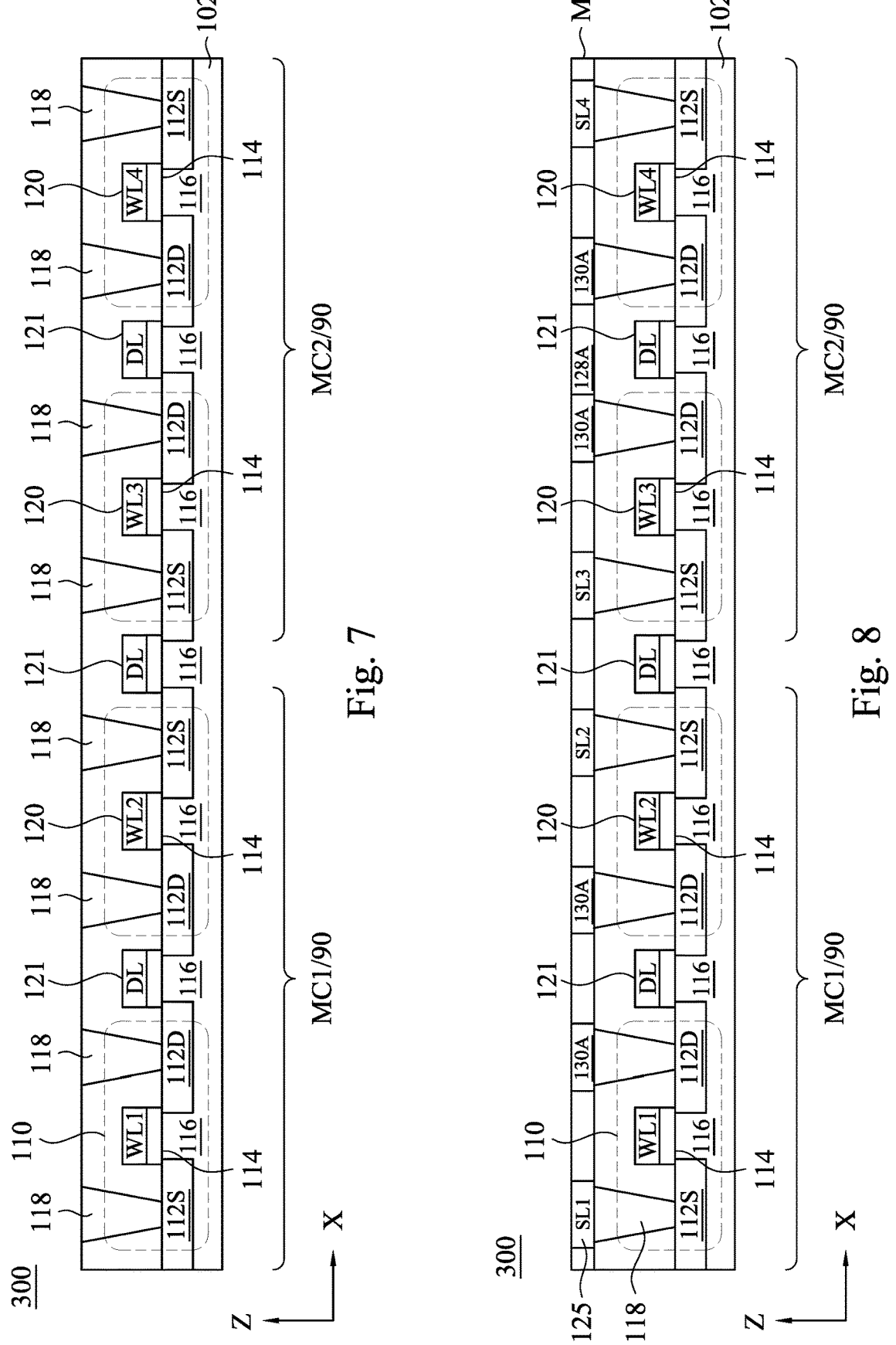

Turning to FIG. 7, contact plugs 118 are formed to make electrical connection to the source regions 112S and the drain regions 112D, in accordance with some embodiments. In some embodiments, the contact plugs 118 are formed by depositing a barrier layer (not individually shown) extending into the openings 106, depositing a conductive material over the barrier layer, and performing a planarization process such as a Chemical Mechanical Polish (CMP) process or a grinding process to remove excess portions of the blanket conductive barrier layer and the conductive material. The barrier layer or the conductive material of the contact plugs 118 may be formed using a suitable process such as Chemical Vapor Deposition (CVD), Physical Vapor Deposition (PVD), Atomic Layer Deposition (ALD), plating, or the like. The barrier layer, if used, may be formed of any suitable material, such as TiN, Ti, TaN, Ta, the like, or combinations thereof.

Turning to FIG. 8, conductive lines 130A are formed to electrically connect the contact plugs 118 and provide electrical routing within the SOT-MRAM device. The conductive lines 130A may be formed within a dielectric layer 128A that is formed over the dielectric layer 104. The dielectric layer 128A may be a material similar to those described above for dielectric layer 104 (see FIG. 6), and may be deposited using similar techniques as dielectric layer 104. The dielectric layer 128A may be considered an Inter-Metal Dielectric layer (IMD) in some embodiments.

The conductive lines 130A may be formed using a suitable technique such as damascene, dual-damascene, plating, deposition, the like, or combinations thereof. In some embodiments, the conductive lines 130A are formed by first depositing the dielectric layer 128A and patterning the dielectric layer 128A to form openings (e.g., using a suitable photolithography and etching process), and then filling the openings in the dielectric layer 128A with conductive material. For example, the conductive lines 130A may be formed by depositing an optional blanket barrier layer (not individually shown) over the patterned dielectric layer 128A, depositing a conductive material over the blanket barrier layer, and performing a planarization process such as a CMP process or a grinding process to remove excess portions of the blanket conductive barrier layer and the conductive material. The barrier layer or the conductive material may be similar to those described above for the contact plugs 118 (see FIG. 7), and may be deposited using similar techniques. In some embodiments, the conductive material of the contact plugs 118 and the conductive lines 130A may be deposited in the same step, for example, if a dual-damascene process is used to form the contact plugs 118 and the conductive lines 130A.

In some embodiments, the conductive lines 130A are formed by first depositing the optional blanket barrier layer over the dielectric layer 104 and contact plugs 118, depositing a conductive material over the blanket barrier layer, and then patterning the barrier layer and conductive material (e.g., using a suitable photolithography and etching process) to form the conductive lines 130A. The dielectric layer 128A may be deposited over the conductive lines 130A and a planarization process is performed to expose the conductive lines 130A.

Figure 9:
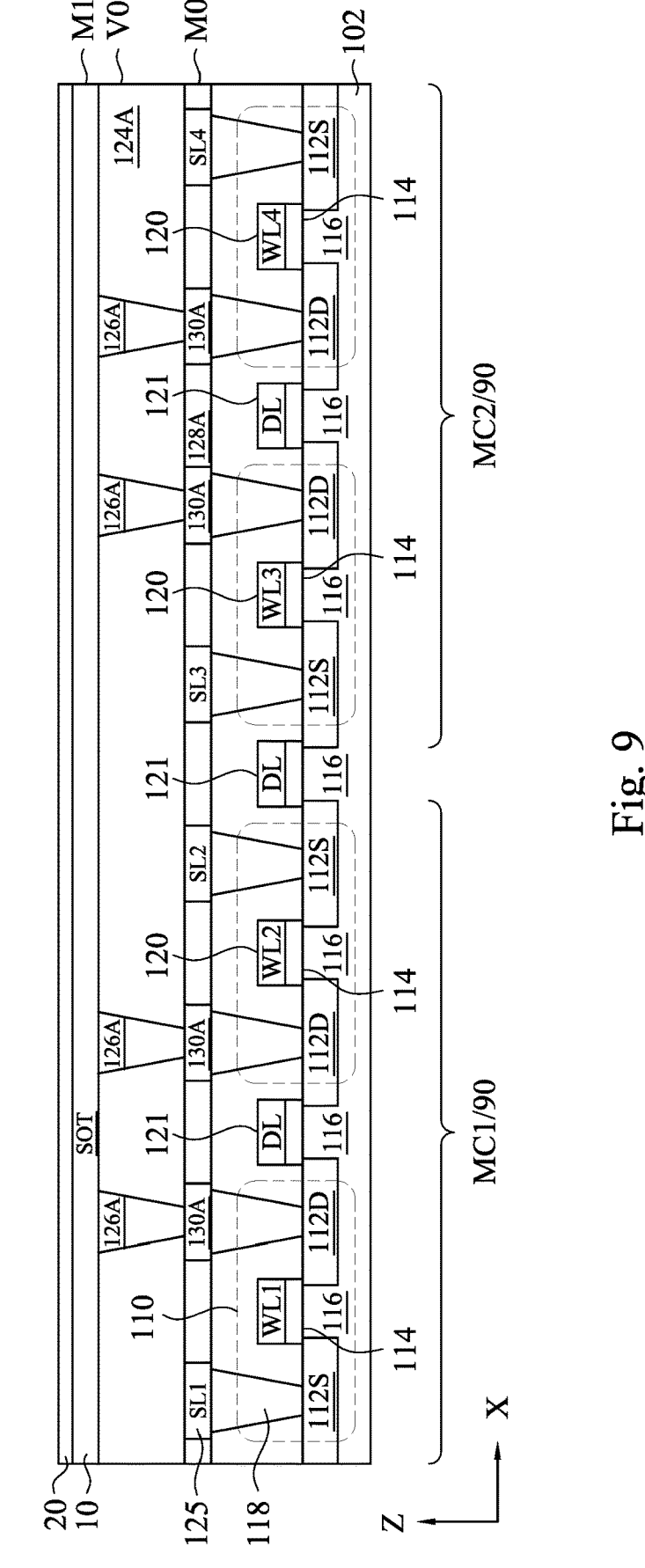

In FIG. 9, vias 126A are formed within a dielectric layer 124A to make electrical connection to the conductive lines 130A, in accordance with some embodiments. In some embodiments, the dielectric layer 124A is first formed over the conductive lines 130A and the dielectric layer 128A. The dielectric layer 124A may be a material similar to those described above for the dielectric layer 104 and the vias 126A may be formed using processes and materials similar to those described above with regard to the contact plugs 118. The process of forming conductive lines and vias are repeated to form a desired number of metal wiring layers.

In some embodiments, the vias 126A formed under the SOT induction structure 10 may be formed using a single damascene process from copper, tungsten, or titanium nitride and can function as bottom electrode 5 (see FIG. 1) for the SOT induction structure 10. An optional barrier layer may also be used, as discussed above with respect to the contact plugs 118 to prevent diffusion of the material of the contact plugs 118 to the surrounding dielectric layer 124A.

As illustrated in FIG. 9, after forming the vias 126A, the film stack of the SOT induction structure 10 may be deposited. As noted above, in some embodiments, the vias 126A may serve as the bottom electrode 5. In some embodiments, the buffer layer 7 may be formed over the vias 126A separately or along with deposition of SOT induction structure 10 using any suitable process. In embodiments utilizing a buffer layer, the buffer layer may include magnesium oxide or the like deposited to a thickness between about 0.2 and 0.9 nm. The bottom electrode 5 may be formed using the techniques discussed above with respect to the formation of the conductive lines 130A.

After forming the buffer layer 7 (if used), the SOT induction structure 10 film stack may be deposited. The SOT induction structure 10 is formed using processes and materials such as those discussed above with respect to FIGS. 3A and 3B. The spacer layer 20 is deposited over the SOT induction structure 10 using processes and materials such as those discussed above with respect to FIGS. 3A and 3B.

In some embodiments, after the spacer layer 20 is deposited, the MTJ film stack 100 is deposited sequentially, as discussed below, without breaking vacuum throughout the deposition processes of depositing the optional buffer layer 7, the SOT induction structure 10, and the MTJ film stack 100.

In some embodiments, after depositing the SOT induction structure 10 film stack, an anneal may be performed to increase perpendicular magnetic anisotropy, such as discussed above with respect to FIGS. 3A and 3B. In some embodiments, the anneal may also be performed in an in-situ perpendicular field to further increase perpendicular magnetic anisotropy. In some embodiments, the SOT induction structure 10 may instead or in addition be annealed after depositing the MTJ film stack 100.

Figure 10:
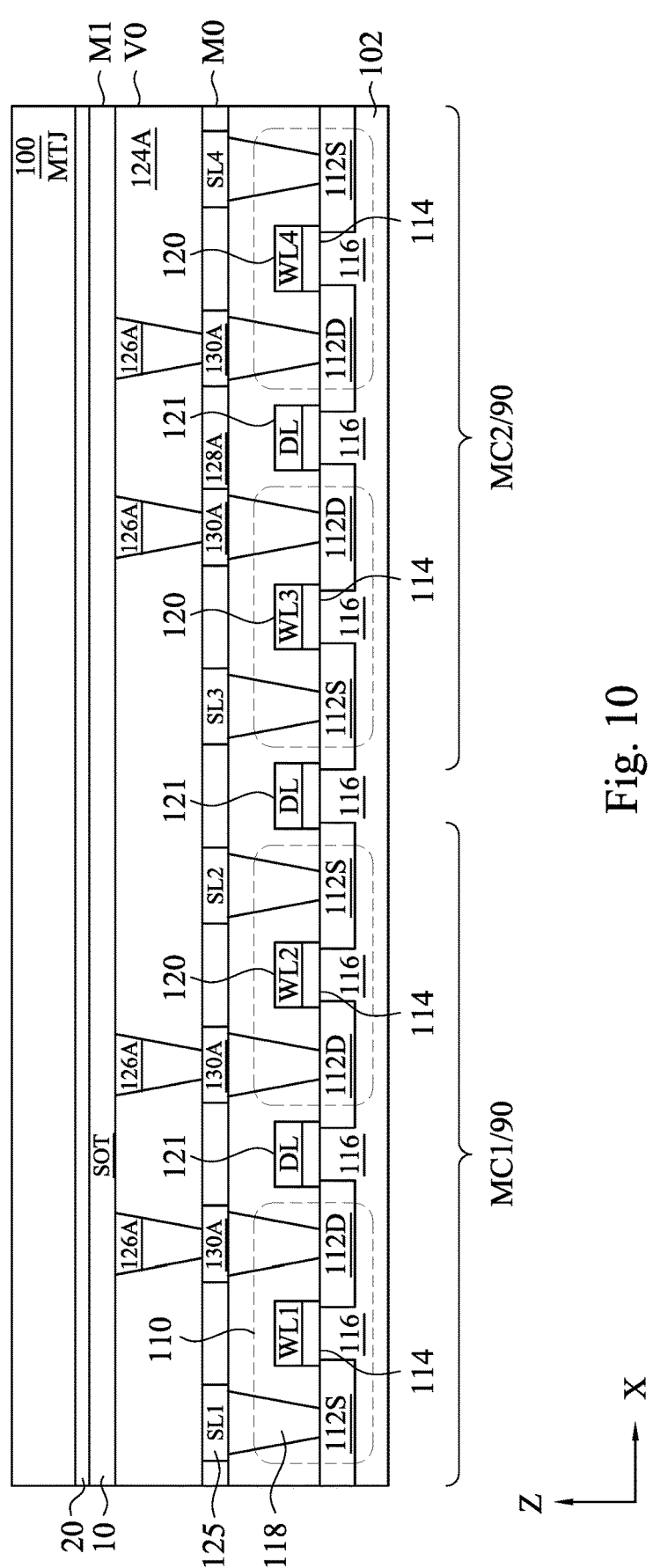

In FIG. 10, the MTJ film stack 100 may be deposited in sequential layers, such as indicated with respect to FIG. 1. Layers for the MTJ film stack 100 are formed over the SOT induction structure 10, including the free layer 30, the barrier layer 40, the reference layer 50, the pinned layer 60, and the capping layer 70. In some embodiments the top electrode 75 (see FIG. 1) is then deposited, while in other embodiments the hard mask 101 (see FIG. 11B) may function as the top electrode. In some embodiments a spacer layer 20 may be formed as a first layer under the free layer 30. Each of the layers of the MTJ film stack 100 can be formed by suitable film formation methods which can provide capability of precise thickness control. Such methods may include, for example, physical vapor deposition (PVD) sputtering. Other methods may include: molecular beam epitaxy (MBE); pulsed laser deposition (PLD); atomic layer deposition (ALD); electron beam (e-beam) epitaxy; or any combinations thereof. It may be possible to use chemical vapor deposition (CVD) or its derivatives if the thickness of the deposition can be precisely controlled.

Following deposition of the MTJ film stack 100 layers an anneal may be performed. If a first anneal after deposition of the SOT induction structure 10 is performed, then in some embodiments, a second anneal after deposition of the MTJ film stack 100 may be performed in the presence of a horizontal magnetic field, for setting the in-plane crystal anisotropy of AFM layer. In particular, the post annealing may be done at a temperature between about 300° C. and about 400° C. for a time between 0.5 hours and 3 hours. The magnetic field may be between about 1 tesla and 5 tesla during the anneal. If a first anneal after deposition of the SOT induction structure 10 is not performed, then the first anneal after deposition of the MTJ film stack 100 may be performed in the presence of a perpendicular magnetic field to enhance the PMA of the SOT induction structure 10. Then a second anneal may also be performed in the presence of a horizontal magnetic field to set the AFM layer.

Figure 11A:
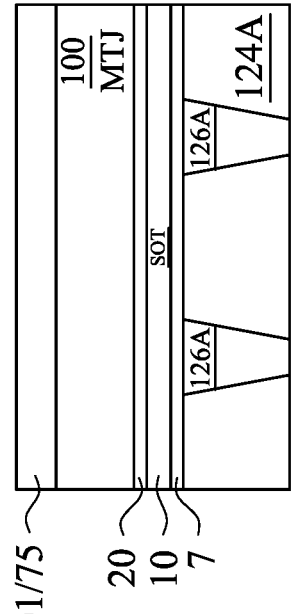
Figure 11B:
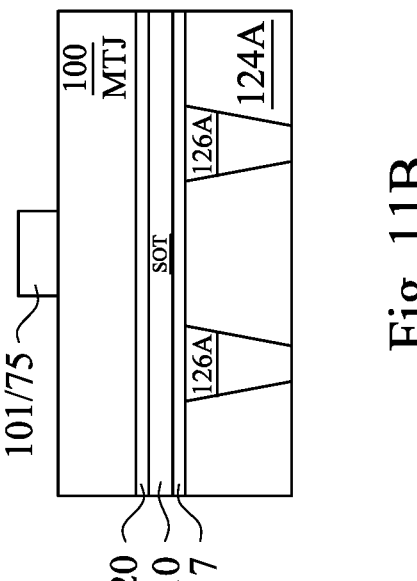

FIGS. 11A, 11B, 11C, 11D, 11E, 11F, and 11G illustrate various views in a process of patterning the MTJ film stack 100 to form an MTJ pillar and patterning the SOT induction structure 10 film stack to form the SOT induction structure 10. In FIG. 11A, a hard mask layer 101 is deposited over the MTJ film stack 100 layers. The hard mask layer 101 may be deposited using any suitable process and may be made of any suitable material, such as silicon nitride, or a conductive metal layer, such as tantalum, tungsten, titanium nitride, the like, or combinations thereof, such as a first layer of a conductive metal and a second layer of a dielectric, such as silicon nitride. In embodiments where the hard mask layer 101 includes a metal, the hard mask layer 101 may also function as the top electrode 75 (FIG. 1) over the MTJ film stack 100. The hard mask layer 101 is patterned by using one or more lithography and etching operations, as shown in FIG. 11B.

Figure 11C:
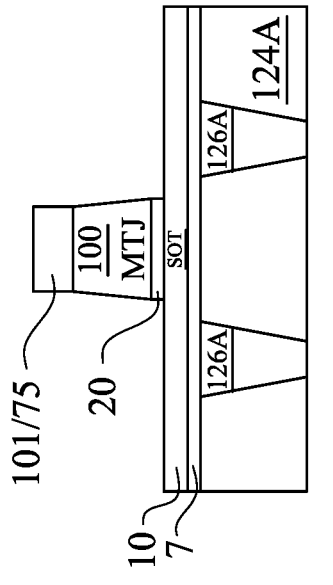

In FIG. 11C, the hard mask layer 101 is used as a mask to pattern the various films of the MTJ film stack 100. In some embodiments, the spacer layer 20 may be patterned with the MTJ film stack 100, such as illustrated in FIG. 11C (and the left hand side of FIG. 12), while in other embodiments, the spacer layer 20 may be patterned with the SOT induction structure 10 film stack, such as illustrated in FIG. 11E (and the right hand side of FIG. 12). Other embodiments may pattern the spacer layer 20 into a first and second spacer layer 20A and 20B, such as illustrated in FIG. 1. In some embodiments, as shown in FIG. 11C, the cross-sectional view of the MTJ film stack 100 has a tapered (mesa) shape. In some embodiments, the hard mask layer 101 or a dielectric portion of the hard mask layer 101 may be consumed in the patterning of the MTJ film stack 100. The remaining metal portion of the hard mask layer 101 may act as the top electrode 75 (hereafter labeled as top electrode 75).

Figure 11D:
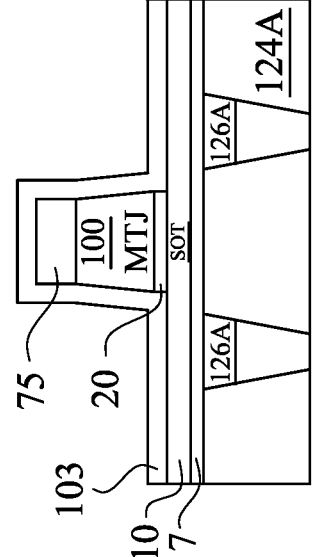

In FIG. 11D, a dielectric protection layer 103 is blanket deposited using any suitable deposition technique, such as PVD, CVD, ALD, the like, or combinations thereof. The dielectric protection layer 103 is deposited over the SOT induction structure 10 films and the patterned MTJ film stack 100, and may be formed of any suitable material such as silicon nitride, silicon carbide, the like, or combinations thereof.

In FIG. 11E, the SOT induction structure 10 film stack is patterned to form the SOT induction structure 10 using suitable photolithography and etching techniques. Where the optional buffer layer 7 is used, it is also patterned along with the SOT induction structure 10 film stack to have the same shape in top view. FIG. 11E also shows an embodiment where the spacer layer 20 is not patterned as part of the MTJ film stack 100, but rather as part of the SOT induction structure 10 film stack. As noted above, the spacer layer 20 may include a portion spacer layer 20B patterned as part of the MTJ film stack 100 and a portion spacer layer 20A patterned as part of the SOT induction structure 10, such as illustrated in FIG. 1.

Figure 11G:
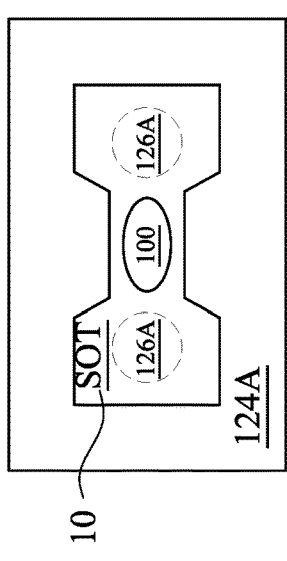
Figure 11F:
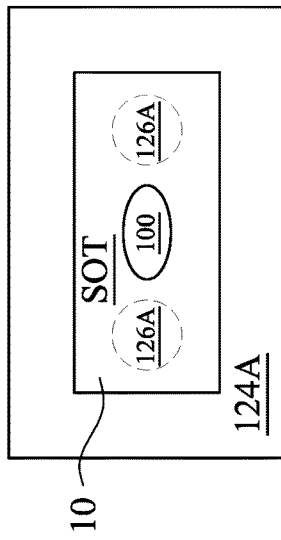
Figure 11E:
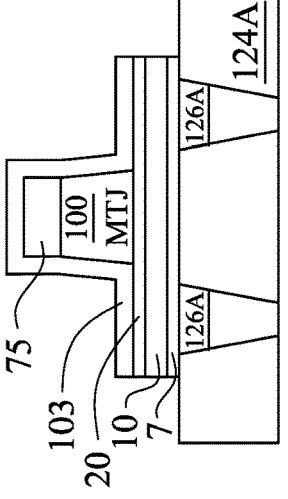

FIGS. 11F and 11G illustrate top down views of the MTJ film stack 100 and SOT induction structure 10. In these views, the dielectric protection layer 103 and top electrode 75 are omitted and the vias 126A are outlined in dash because they are under the SOT induction structure 10. The shape of the SOT induction structure 10 may be rectangular (as in FIG. 11F) or oval, and in some embodiments, such as illustrated in FIG. 11G, may have a portion in the middle which is narrower than the outer portions (like an hour glass or bow tie), with the narrow portion aligned to the MTJ film stack 100.

Figure 12:
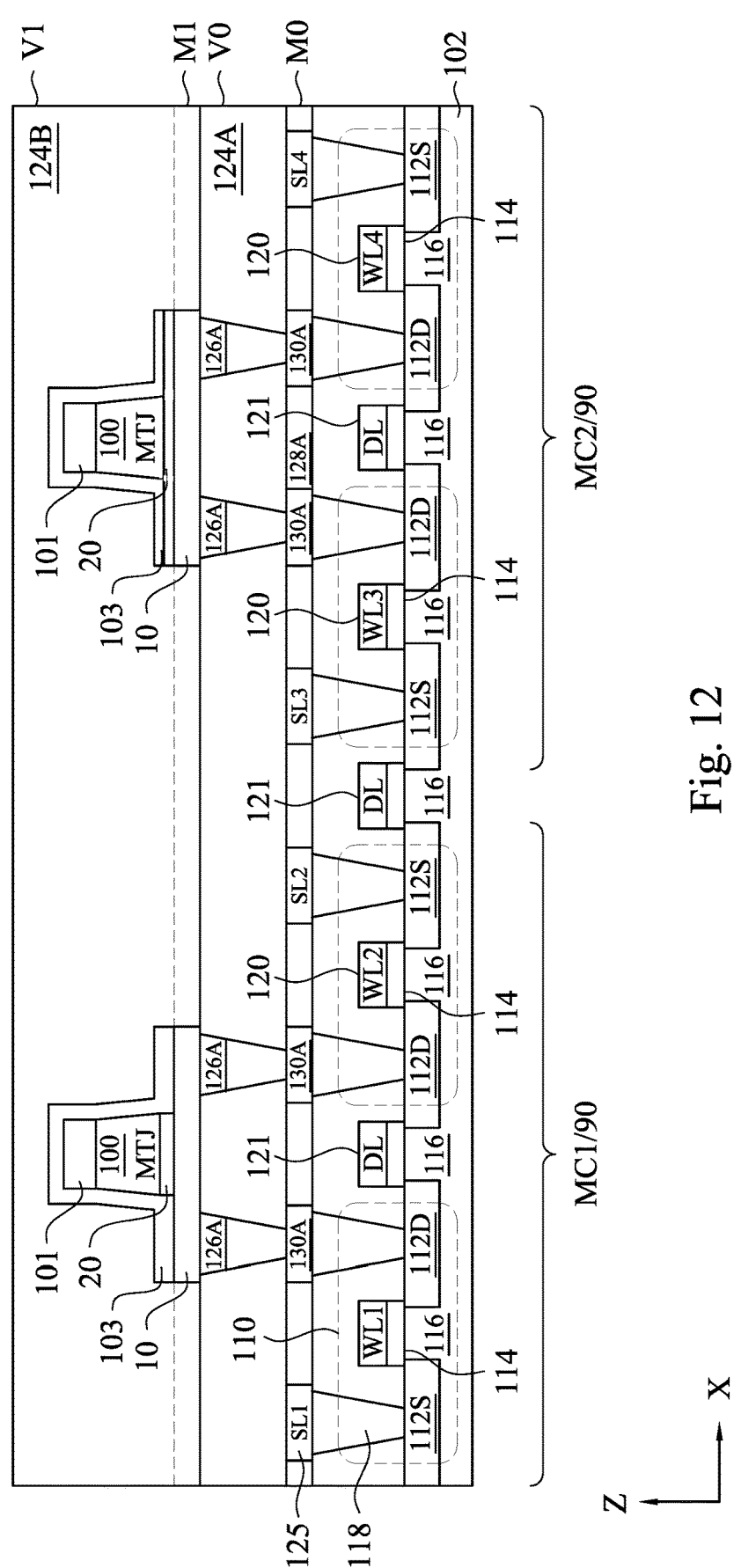

In FIG. 12, after patterning the MTJ film stack 100 and the SOT induction structure 10, one or more dielectric material layers, e.g., ILD 124B, including any of the ILD candidate materials described above, are deposited to fully cover the MTJ film stack 100. A planarization operation, such as CMP, may be performed to level the upper surface of the ILD 124B. In some embodiments, the CMP will have a floating stop in the ILD 124B, such as illustrated in FIG. 12. In other embodiments, the CMP may stop on the protective dielectric layer 103. As noted above, the left hand side MTJ film stack 100, spacer layer 20, and SOT induction structure 10 are patterned so that the spacer layer 20 is patterned with the MTJ film stack 100 and has the same shape as the MTJ film stack 100. The right hand side MTJ film stack 100, spacer layer 20, and SOT induction structure 10 are patterned so that the spacer layer 20 is patterned with the SOT induction structure 10 and has the same shape as the SOT induction structure 10. This embodiment view is omitted in subsequent Figures. A combination of the two may also be utilized, in accordance with some embodiments.

Figure 13:
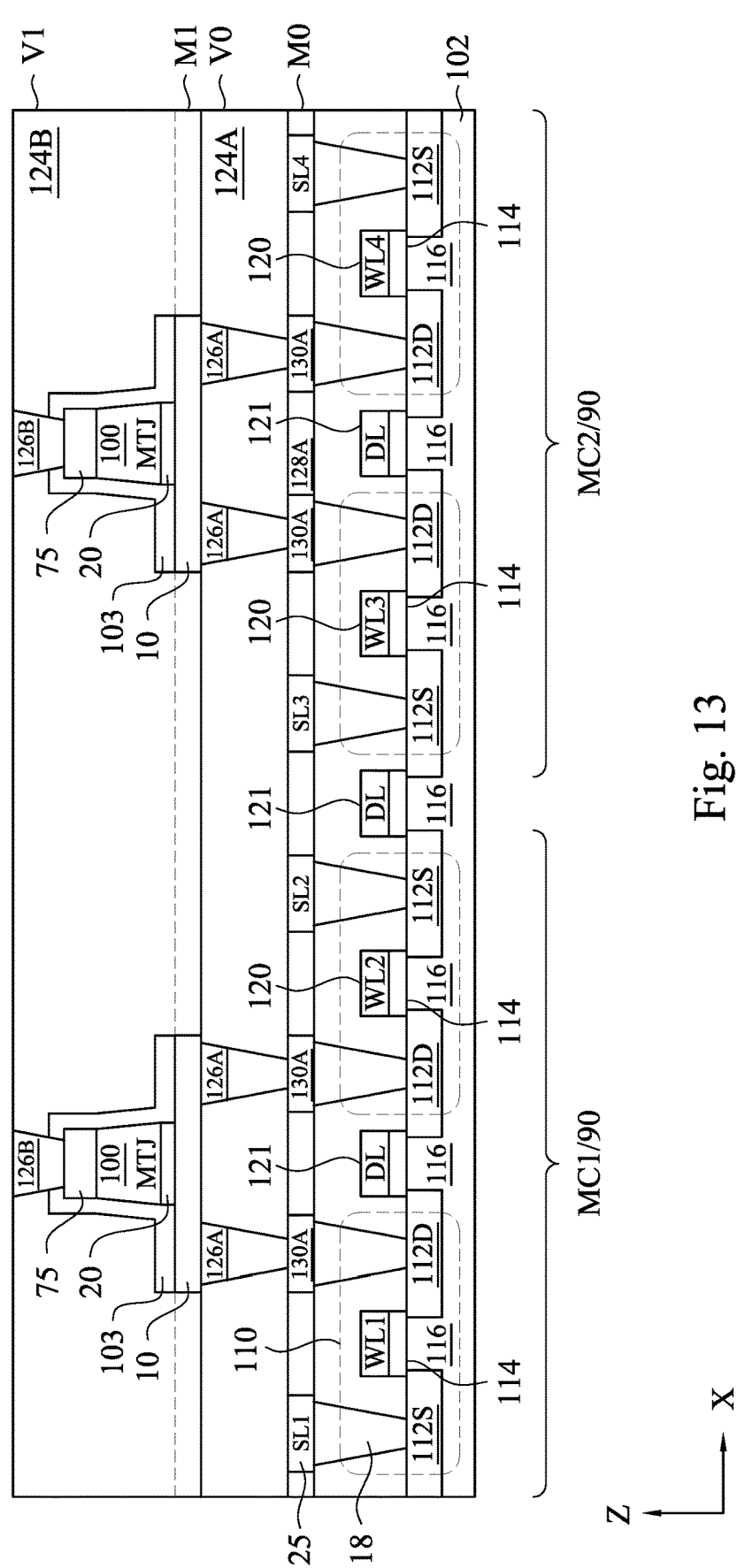

In FIG. 13, after forming the MTJ film stacks 100 and depositing the ILD 124B and performing a CMP, vias 126B may be formed through the ILD 124B and protective dielectric layer 103 to contact the top electrode 75 over the MTJ film stack 100. Vias 126B may be formed using processes and materials similar to those used to form vias 126A. For example, vias 126B may be formed using a damascene process where a mask is used to pattern openings in the ILD 124B and etch the dielectric protective layer 103, and an optional diffusion barrier layer is deposited in the openings followed by conductive plug material, followed by a CMP.

In FIG. 14, conductive lines 130C are formed to electrically connect the vias 126B and provide electrical routing within the SOT-MRAM device 300 to the bit lines 160. The conductive lines 130C may be formed within a dielectric layer 128C that is formed over the ILD 124B. The dielectric layer 128C may be a material similar to those described above for dielectric layer 104, and may be deposited using similar techniques as dielectric layer 104. The dielectric layer 128C may be considered an Inter-Metal Dielectric layer (IMD) in some embodiments.

FIG. 15 illustrates an embodiment of an SOT-MRAM device 400 where the source region 112S of adjacent FETs no is shared between two SOT-MRAM cells 90, such as MC1 and MC2. Sharing the source line SL (e.g., SL2/3 as illustrated) and source regions 112S allows for greater device density. The SOT-MRAM device 400 may be formed using processes and materials similar to those used to form the SOT-MRAM device 300.

FIG. 16 illustrates a three-dimensional view of an of SOT-MRAM cell 90, e.g., MC1, of the SOT-MRAM device 300 of FIG. 14, in accordance with some embodiments. Materials, configurations, dimensions, processes, and/or operations described with respect to FIGS. 1 through 14 may be employed in the following embodiments, and detailed explanation thereof may be omitted.

In some embodiments, a word line 120 (coupled to a gate of FET 110) extends in the Y-direction and the source lines 125 SL1 and SL2 extend in the X-direction. The SOT induction structure 10 is located above the source or drain regions of two adjacent FETs no and is coupled at either end to the respective source or drain regions of the two adjacent FETs no by vias and metal wiring layers. The SOT induction structure 10 may have a direction which is predominantly in the X-direction, in some embodiments.

As shown in FIG. 16, the MTJ film stack 100 is disposed over the SOT induction structure 10 with a spacer layer 20 interposed between the MTJ film stack 100 and the SOT induction structure 10, in some embodiments. The MTJ film stack 100 may have a rounded pillar or cylinder in ellipse shape, which may taper as illustrated in other Figures. The bit line 160 is electrically coupled to the top of the MTJ film stack 100 by a via and/or top electrode of the MTJ film stack and may extend in the X-direction.

FIG. 17 is a portion of a circuit diagram of an SOT-MRAM device consistent with the SOT-MRAM device 300, in accordance with some embodiments. Materials, configurations, dimensions, processes, and/or operations described with respect to FIGS. 1-14 may be utilized in the following embodiments, and detailed explanation thereof may be omitted.

In some embodiments, bit lines BL and source lines (e.g., SL1 and SL2) extend in a row direction, and word lines (e.g., WL1 and WL2) extend in a column direction. SOT-MRAM cells are disposed at locations defined by a bit line BL, two word lines WL1 and WL2, and two source lines SL1 and SL2, in some embodiments. The number of memory cells coupled to the same word lines and/or the same bit lines is not limited to three or four and can be more than 3, e.g., 4, 8, 16, 32, 64, 128, 256, 512 or 1024 or more. The word lines WL1 and WL2 are coupled to a word driver circuit (row decoder), the source lines SL1 and SL2 are coupled to a current source circuit which also functions as a write driver circuit in conjunction with the word driver circuit. One end of the SOT induction structure 10 (SOT) is coupled to a source or drain of a FET 110 (see FIG. 14), and the other end of SOT induction structure SOT is coupled to another source or drain of a FET 110. One end of the MTJ film stack M is coupled to the SOT induction structure SOT and the other end of the MTJ film stack M is coupled to a corresponding bit line BL. The gates of the FETs no are coupled to the word lines WL1 and WL2, and the drain or source of the corresponding FETs no are coupled to source lines SL1 and Sl2.

In the embodiment of FIG. 17, vertically adjacent SOT-MRAM cells along the column direction are coupled to the same read word lines WL1 and WL2, respectively. Horizontally adjacent SOT-MRAM cells along the row direction are coupled to the same bit lines BL and the same source lines SL1 and SL2, respectively. In some embodiments, adjacent FETs no in neighboring SOT-MRAM cells along the row direction may share the same source line SL such as illustrated in FIG. 15.

Figure 18:
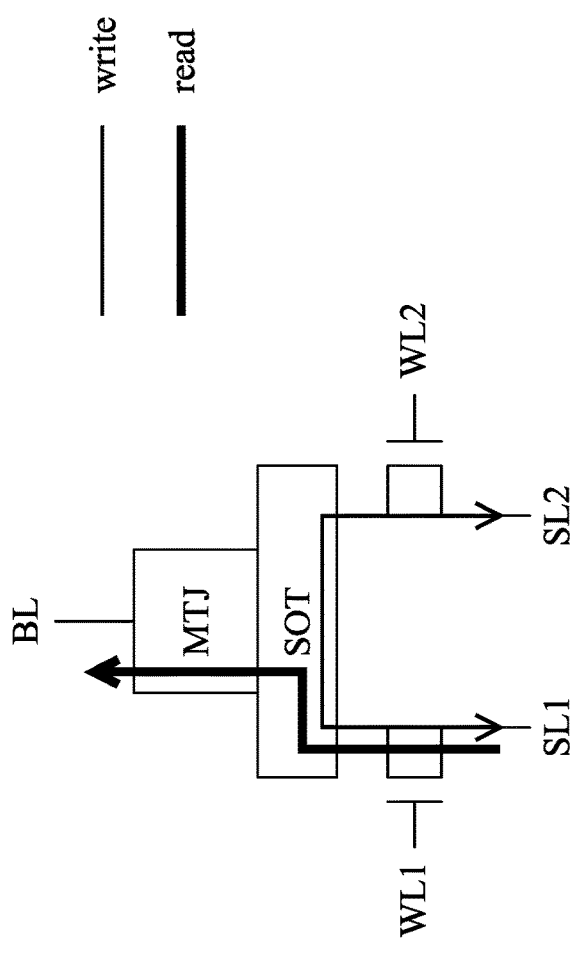
FIG. 18 illustrates operations of an SOT-MRAM cell according to some embodiments.

FIG. 18 shows operations of an SOT-MRAM cell according to an embodiment of the present disclosure. In a writing operation, a write current flows through the SOT induction structure SOT. When writing a first type of data (e.g., "0") to the MTJ film stack 100, the word line WL1 and the word line WL2 are set to turn on the gate electrodes of the FETs no. The first source line SL1 is set to a first potential (e.g., write voltage Vw) and the second source line SL2 is set to a second potential (e.g., ground or 0 V), the first potential greater than the second potential. The bit line BL can be floating. Electrons flowing in the parallel Hall metal of the SOT induction structure 10 have a positive spin Hall angle and induce SOT on the free layer 30 to cause the spin characteristics of the electrons of the free layer 30 to change.

When writing a second type of data (e.g., "1") to the MTJ film stack 100, the word line WL1 and the word line WL2 are set to turn on the gate electrodes of the FETs no. The first source line SL1 is set to the second potential (e.g., ground or 0V) and the second source line SL2 is set to the first potential (e.g., write voltage Vw), the first potential greater than the second potential. The bit line BL can be floating. Electrons flowing in the parallel Hall metal of the SOT induction structure 10 in the reverse direction have a negative spin Hall angle and induce SOT on the free layer 30 to cause the spin characteristics of the electrons of the free layer 30 to change.

When reading data from the MTJ film stack 100, the read operation can be done in several different ways. Either one of the word lines WL1 or WL2 switches on the corresponding FET 110 while the other is off. The SL1 or SL2 connected to the off gate can be floating, while the SL1 or SL2 connected to the on gate is coupled to the second potential (e.g., ground or 0V). The potential Vread at the bit line BL can be used to calculate the resistance of the SOT and MTJ, thereby determining whether the MTJ is set to a "1" state or a "0" state. The amplitude of Vread is about ½ to about ⅕₀ of Vw in some embodiments. In other embodiments, the read current flows opposite, from the bit line BL to the source line SL1 or SL2 from the MTJ film stack 100 to the SOT induction wiring layer 15, in other words, from the read bit line RBL to the source line SL. In such a case, the Vread is higher than the source line voltage (e.g., Vread is positive).

Embodiments advantageously provide several configurations to enhance effectiveness, reduce complexity, and reduce power consumption of an SOT-MRAM device. A strained PMA Hall metal SOT induction structure is used to provide SOT induction on a free layer in some embodiments. The strained PMA Hall metal SOT induction structure allows the SOT-MRAM device to be formed without using a thick heavy metal seed layer to provide perpendicular magnetic anisotropy, thereby reducing power consumption and increasing spin Hall angle. Some embodiments also use a spacer layer between the SOT induction structure and the free layer of an MTJ film stack. The spacer layer provides flexibility to optimize magnetic coupling between the PMA SOT induction structure and IMA free layer. This allows the SOT induction structure to operate under an internally generated magnetic field rather than an externally generated magnetic field. Embodiments can combine the (seedless) strained SOT induction structure and the spacer layer to provide further advantages in efficiency while reducing power consumption, thereby allowing for the use of smaller switching transistors.

One embodiment is a magnetic memory device including a first spin-orbit torque (SOT) induction structure, the first SOT induction structure may include a Hall metal having perpendicular magnetic anisotropy. The magnetic memory device also includes a first magnetic tunnel junction (MTJ) stack disposed over the first SOT induction structure. The device also includes a first conductive line coupled to a first side of the first SOT induction structure. The device also includes a second conductive line coupled to a second side of the first SOT induction structure. In an embodiment, the first SOT induction structure may include alternating metal layers of a first non-ferromagnetic metal and a second ferromagnetic metal. In an embodiment, a bottom layer of the first metal has a greater thickness than a second layer of the first metal, a first layer of the second metal interposed between the bottom layer and the second layer. In an embodiment, the first metal has a first lattice constant and the second metal has a second lattice constant, where the first lattice constant and the second lattice constant are different. In an embodiment, the first metal has a first thickness, where the second metal has a second thickness, and where the SOT induction structure is free of a metal seed layer having a third thickness greater than 10 times the first thickness or 10 times the second thickness. In an embodiment, the magnetic memory device may include: a spacer layer interposed between the first SOT induction structure and the first MTJ stack. In an embodiment, the spacer layer may include a metal or a metal oxide. In an embodiment, the spacer layer may include aluminum oxide, magnesium oxide, cobalt oxide, tungsten, ruthenium, platinum, molybdenum, titanium, or magnesium.

Another embodiment is a magnetic memory device including first spin-orbit torque (SOT) induction structure, the first SOT induction structure including a Hall metal. The magnetic memory device also includes a top-pinned magnetic tunnel junction (MTJ) stack disposed over the first SOT induction structure, the MTJ stack including a spacer layer interposed between a free layer of the MTJ stack and the first SOT induction structure. The magnetic memory device also includes a first conductive line coupled to a first side of the first SOT induction structure. The magnetic memory device also includes a second conductive line coupled to a second side of the first SOT induction structure. In an embodiment, the MTJ stack includes: the free layer, a barrier layer over the free layer, the reference layer over the barrier layer, a second spacer layer over the reference layer, and the pinned layer over the second spacer layer. In an embodiment, the first SOT induction structure includes alternating metal layers of a first ferromagnetic material and a second non-ferromagnetic material. In an embodiment, a lattice misfit of the first ferromagnetic material and the second non-ferromagnetic material is between 6% and 10%. In an embodiment, the spacer layer has a shape in top down view which is the same shape as a shape of the SOT induction structure.

Another embodiment is a magnetic memory device including a first spin-orbit torque (SOT) induction structure, the first SOT induction structure may include a multi-layer Hall metal having perpendicular magnetic anisotropy. The magnetic memory device also includes a first magnetic tunnel junction (MTJ) stack disposed over the first SOT induction structure. The device also includes a first source/drain of a first transistor coupled to a first side of the first SOT induction structure. The device also includes a second source/drain of a second transistor coupled to a second side of the first SOT induction structure. In an embodiment, the first SOT induction structure may include alternating metal layers of a first metal and a second metal, where a first thickness of the first metal is between 1 nm and 2 nm, and a second thickness of the second metal is between 0.01 nm and 0.7 nm. In an embodiment, the first SOT induction structure may include: a first metal layer may include a first metal, where a thickness of the first metal layer is between 2 nm and 5 nm, and alternating metal layers of a second metal and a third metal, where a thickness of each of the alternating metal layers is between 0.01 nm and 2 nm. In an embodiment, the first metal and the second metal are the same material. In an embodiment, a first thickness of the first metal layer is between 2 nm and 5 nm, where a second thickness of each of the alternating metal layers of the second metal and the third metal are between 0.01 nm and 2 nm. In an embodiment, the magnetic memory device may include a spacer layer interposed between the first MTJ stack and the first SOT induction structure. In an embodiment, the first SOT induction structure may include alternating metal layers of a first metal and a second metal, where a lattice misfit between the first metal and the second metal is between 6% and 10%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
  forming a first spin-orbit torque (SOT) induction structure over a first conductive line, wherein forming the first SOT induction structure comprises blanket depositing alternating metal layers of a first metal and a second metal, the first metal comprising a non-ferromagnetic metal and the second metal comprising a ferromagnetic metal;
  after blanket depositing each of the alternating metal layers, annealing the alternating metal layers, wherein annealing the alternating metal layers comprises applying a perpendicular magnetic field while annealing the alternating metal layers;
  forming a first magnetic tunnel junction (MTJ) stack over the first SOT induction structure; and
  connecting a word line to a top surface of the MTJ stack.

2. The method of claim 1, wherein forming the SOT induction structure comprises blanket depositing the alternating metal layers without a heavy metal seed layer.

3. The method of claim 1, wherein annealing the alternating metal layers comprises annealing the alternating metal layers before forming the first MTJ stack.

4. The method of claim 1, wherein annealing the alternating metal layers comprises annealing the alternating metal layers after forming the first MTJ stack.

5. The method of claim 1 further comprising depositing a spacer layer over the SOT induction structure, wherein forming the first MTJ stack comprises:
  depositing the first MTJ stack over the spacer layer; and
  patterning the first MTJ stack, wherein patterning the first MTJ stack comprises an etching process that at least partially etches the spacer layer.

6. The method of claim 5, wherein etching the spacer layer forms a first spacer layer over a second spacer layer, the first spacer layer being wider than the second spacer layer.

7. The method of claim 5, wherein the spacer layer comprises aluminum oxide, magnesium oxide, cobalt oxide, tungsten, ruthenium, platinum, molybdenum, titanium, or magnesium.

8. The method of claim 1, wherein forming the SOT induction structure comprises:
  forming a base metal layer of the first metal, wherein the alternating metal layers are blanket deposited over the base metal layer.

9. The method of claim 8, wherein the base metal layer is thicker than each layer of the alternating metal layers.

10. The method of claim 1, wherein forming the SOT induction structure comprises:
  forming a base metal layer of a different metal than the first metal, wherein the alternating metal layers are blanket deposited over the base metal layer.

11. The method of claim 1, wherein the first metal has a first lattice constant and the second metal has a second lattice constant, wherein the first lattice constant and the second lattice constant are different.

12. A method comprising:
  forming a first induction structure comprising alternating metal layers of a first ferromagnetic material comprising cobalt and a second non-ferromagnetic material, wherein a ratio of a first thickness of a first layer of the alternating metal layers to a second thickness of a second layer of the alternating metal layers is in a range of 2 to 20, the first layer being made of the second non-ferromagnetic material, and the second layer being made of the first ferromagnetic material;
  depositing a spacer layer over the first induction structure;
  forming a magnetic tunnel junction (MTJ) stack over the spacer layer, wherein forming the MTJ stack comprises depositing a free layer in contact with the spacer layer;
  annealing the alternating metal layers before forming the MTJ stack;
  coupling a first conductive line to a first surface of the first induction structure; and
  coupling a second conductive line to the first surface of the first induction structure.

13. The method of claim 12, wherein the ratio of the first thickness to the second thickness is in a range of 3 to 10.

14. The method of claim 12, wherein the second non-ferromagnetic material comprises platinum or palladium.

15. The method of claim 12, wherein annealing the alternating metal layers comprises applying a perpendicular magnetic field while annealing the alternating metal layers.

16. A method comprising: forming a first spin-orbit torque (SOT) induction structure, the first SOT induction structure comprising multi-layer Hall metal having perpendicular magnetic anisotropy without a heavy metal seed layer, wherein the first SOT induction structure is electrically coupled to a first source/drain of a first transistor and a second source/drain of a second transistor, wherein the first SOT induction structure comprises alternating layers of a first ferromagnetic metal and a second non-ferromagnetic metal, and wherein a lattice mismatch between the first ferromagnetic metal and the second non-ferromagnetic metal is in a range of 6% to 10%; depositing a spacer structure over the first SOT induction structure directly on the SOT induction structure; and forming a first magnetic tunnel junction (MTJ) stack directly on the spacer structure, the first MTJ stack including a free layer that is in direct physical contact with the spacer structure, the free layer having an in-plane magnetic anisotropy, wherein the spacer structure comprises: a first spacer layer; and a second spacer layer over and having a same material composition as the first spacer layer, the second spacer layer having a same width as the first MTJ stack, the first spacer layer being wider than the second spacer layer.

17. The method of claim 16 further comprising annealing the alternating layers before forming the MTJ stack.

18. The method of claim 17, wherein annealing the alternating layers comprises applying a perpendicular magnetic field while annealing the alternating layers.

19. The method of claim 16 further comprising annealing the alternating layers after forming the MTJ stack.

20. The method of claim 19, wherein annealing the alternating layers comprises applying a perpendicular magnetic field while annealing the alternating layers.

\* \* \* \* \*